(12) United States Patent
Iwata et al.

(10) Patent No.: US 9,376,763 B2
(45) Date of Patent: Jun. 28, 2016

(54) MANUFACTURING METHOD AND MANUFACTURING APPARATUS OF A GROUP III NITRIDE CRYSTAL, UTILIZING A MELT CONTAINING A GROUP III METAL, AN ALKALI METAL, AND NITROGEN

(71) Applicants: Hirokazu Iwata, Miyagi (JP); Seiji Sarayama, Miyagi (JP); Minoru Fukuda, Kanagawa (JP); Tetsuya Takahashi, Osaka (JP); Akira Takahashi, Kanagawa (JP)

(72) Inventors: Hirokazu Iwata, Miyagi (JP); Seiji Sarayama, Miyagi (JP); Minoru Fukuda, Kanagawa (JP); Tetsuya Takahashi, Osaka (JP); Akira Takahashi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 555 days.

(21) Appl. No.: 13/679,499

(22) Filed: Nov. 16, 2012

(65) Prior Publication Data
US 2013/0074762 A1    Mar. 28, 2013

Related U.S. Application Data

(62) Division of application No. 11/596,250, filed as application No. PCT/JP2006/304934 on Mar. 13, 2006, now Pat. No. 8,337,617.

(30) Foreign Application Priority Data

Mar. 14, 2005  (JP) ................................ 2005-070833
Mar. 14, 2005  (JP) ................................ 2005-070859
Mar. 14, 2005  (JP) ................................ 2005-070889
Mar. 10, 2006  (JP) ................................ 2006-066574

(51) Int. Cl.
*C30B 19/10*  (2006.01)
*C30B 19/02*  (2006.01)
(Continued)

(52) U.S. Cl.
CPC . *C30B 19/02* (2013.01); *C30B 9/00* (2013.01); *C30B 15/00* (2013.01); *C30B 15/32* (2013.01);
(Continued)

(58) Field of Classification Search
CPC .............. C30B 9/00; C30B 9/04; C30B 9/06; C30B 9/08; C30B 9/10; C30B 19/00; C30B 19/02; C30B 19/04; C30B 19/08; C30B 19/10; H01L 21/208
USPC ........... 117/11, 54, 56, 60, 64–65, 67, 73–74, 117/76–79, 937, 952
See application file for complete search history.

(56) References Cited

U.S. PATENT DOCUMENTS 6,270,569 B1  8/2001  Shibata et al.
6,562,124 B1  5/2003  Ivantzov et al.
(Continued)

FOREIGN PATENT DOCUMENTS

CN  1938457 A  3/2007
EP  1439572 A2  7/2004
(Continued)

OTHER PUBLICATIONS

European search report dated Jun. 17, 2011 in connection with counterpart European patent application No. 06728999.
(Continued)

*Primary Examiner* — Kenneth A Bratland, Jr.
(74) *Attorney, Agent, or Firm* — Cooper & Dunham LLP

(57) ABSTRACT

A method for manufacturing a group III nitride crystal on a seed crystal in a holding vessel holding therein a melt containing a group III metal, an alkali metal and nitrogen. The manufacturing method comprises the steps of causing the seed crystal to make a contact with the melt, setting an environment of the seed crystal to a first state offset from a crystal growth condition while in a state in which said seed crystal is in contact with the melt, increasing a nitrogen concentration in the melt, and setting the environment of the seed crystal to a second state suitable for crystal growth when the nitrogen concentration of the melt has reached a concentration suitable for growing the seed crystal.

6 Claims, 26 Drawing Sheets

(51) Int. Cl.
  *C30B 9/00* (2006.01)
  *C30B 15/00* (2006.01)
  *C30B 15/32* (2006.01)
  *C30B 17/00* (2006.01)
  *C30B 29/40* (2006.01)
  *C30B 19/06* (2006.01)

(52) U.S. Cl.
  CPC ............... *C30B 17/00* (2013.01); *C30B 19/06* (2013.01); *C30B 29/403* (2013.01); *C30B 29/406* (2013.01); *Y10T 117/1024* (2015.01); *Y10T 117/1032* (2015.01)

(56) References Cited

U.S. PATENT DOCUMENTS

| | | | |
|---|---|---|---|
| 2002/0175338 A1 | 11/2002 | Sarayama et al. | |
| 2004/0003495 A1 | 1/2004 | Xu | |
| 2004/0031437 A1 | 2/2004 | Sarayama et al. | |
| 2004/0134413 A1* | 7/2004 | Iwata | C30B 9/00 117/2 |
| 2004/0144300 A1 | 7/2004 | Kitaoka et al. | |
| 2004/0262630 A1* | 12/2004 | Kitaoka | H01L 21/02389 257/189 |

FOREIGN PATENT DOCUMENTS

| | | |
|---|---|---|
| JP | 2001-58900 | 3/2001 |
| JP | 2001-64097 | 3/2001 |
| JP | 2001-64098 | 3/2001 |
| JP | 2001-102316 | 4/2001 |
| JP | 2001-119103 | 4/2001 |
| JP | 2002-68896 | 3/2002 |
| JP | 2002-128586 | 5/2002 |
| JP | 2002-201100 | 7/2002 |
| JP | 2002-338397 | 11/2002 |
| JP | 2002326898 | 11/2002 |
| JP | 2003-12400 | 1/2003 |
| JP | 2003-81696 | 3/2003 |
| JP | 2003-160398 | 6/2003 |
| JP | 2003-160399 | 6/2003 |
| JP | 2003-206198 | 7/2003 |
| JP | 2003-212696 | 7/2003 |
| JP | 2003-238296 | 8/2003 |
| JP | 2003-286098 | 10/2003 |
| JP | 2003-286099 | 10/2003 |
| JP | 2003-292400 | 10/2003 |
| JP | 2003-300798 | 10/2003 |
| JP | 2003-300799 | 10/2003 |
| JP | 2003-313097 | 11/2003 |
| JP | 2003-313098 | 11/2003 |
| JP | 2003-313099 | 11/2003 |
| JP | 2004-168650 | 6/2004 |
| JP | 2004-189549 | 7/2004 |
| JP | 2004-189590 | 7/2004 |
| JP | 2004-224600 | 8/2004 |
| JP | 2004-231447 | 8/2004 |
| JP | 2004-244307 | 9/2004 |
| JP | 2004-277224 | 10/2004 |
| JP | 2004-307322 | 11/2004 |
| JP | 2004-533391 | 11/2004 |
| JP | 2006-8416 | 1/2006 |
| WO | WO2006/095536 A | 9/2006 |

OTHER PUBLICATIONS

Hisanori Yamane, et al. (1997), "Preparation of GaN Single Crystals Using a Na Flux". Chem. Mater., vol. 9, No. 2, 1997, pp. 413-416.

Jul. 4, 2008 Chinese official action (and English translation thereof) dated Jul. 4, 2008 in connection with counterpart Chinese patent application No. 2006800002301.

* cited by examiner

MANUFACTURING METHOD AND MANUFACTURING APPARATUS OF A GROUP III NITRIDE CRYSTAL, UTILIZING A MELT CONTAINING A GROUP III METAL, AN ALKALI METAL, AND NITROGEN

CROSS-REFERENCE TO RELATED APPLICATIONS

This application is a divisional of U.S. application Ser. No. 11/596,250, filed on Nov. 13, 2006 as a Section 371 national stage of International Application No. PCT/JP2006/304934 filed Mar. 13, 2006, which claims the priority of Japanese Patent Application Nos. 2005-070833, 2005-070859, 2005-070889, each filed with the Japan Patent Office on Mar. 14, 2005, and Japanese Patent Application No. 2006-066574 filed with the Japan Patent Office on Mar. 10, 2006

TECHNICAL FIELD

The present invention generally relates to manufacturing method of a group III nitride crystal and manufacturing apparatus of a group III nitride crystal, and more specifically to a manufacturing method of a group III nitride crystal by a flux process and a manufacturing method suitable for implementing the foregoing manufacturing method.

BACKGROUND ART

These days, most of the InGaAlN (a group III nitride semiconductor) devices used for ultraviolet, violet, blue and green optical sources are formed on a substrate of sapphire or silicon carbide (SiC) by conducting thereon an MOCVD process (metal-organic chemical vapor deposition process) or MBE process (molecular beam epitaxy process). In such a case, however, a large amount of crystal defects are included in the group III nitride crystal in view of large difference of thermal expansion coefficient and lattice constant between the substrate and the group III nitride semiconductor layers. In the case of a light-emitting device, for example, problems such as short lifetime, large operational power consumption, and the like, are caused as a direct consequence of such crystal defects existing with high density.

DISCLOSURE OF THE INVENTION

Further, because a sapphire substrate is an insulator, it is impossible to provide an electrode directly on the substrate contrary to conventional light-emitting devices constructed on a semiconductor substrate. This means that it is necessary to provide an electrode on the group III nitride semiconductor layer. However, such a construction has a drawback of needing large device area and tends to invite an associated problem of high device cost. In addition, there is caused a problem of warp of the substrate because of the use of different materials such as sapphire substrate in combination with the group III nitride semiconductor layers. This problem of warp becomes a serious problem particularly when the device area is increased.

Further, with the group III nitride semiconductor device constructed on a sapphire substrate, chip separation by way of cleaving process becomes difficult, and it is not easy to obtain an optical cavity edge surface, which is required in laser diodes (LD). Thus, it is practiced in the art to form the cavity edge surface by a dry etching process or a process somewhat similar to a cleaving process after polishing the sapphire substrate to a thickness of 100 μm or less. Thus, it has been difficult to conduct formation of optical cavity edge surface and chip separation with a single step, contrary to the production process of conventional laser diodes, and there has been a problem of increased cost because of the complexity of the fabrication process.

In order to solve these problems, there has been made a proposal of reducing the crystal defects by conducting selective growth process of the group III nitride semiconductor layers on the sapphire substrate in a lateral direction. With this approach, it has become possible to reduce the crystal defects successfully, while there still remain problems of insulating nature of the sapphire substrate and difficulty of cleaving a sapphire substrate with such a construction.

In order to solve these problems, use of a gallium nitride (GaN) substrate of generally the same composition to the crystalline materials grown thereon is preferable. Thus, there are conducted investigations of growing a bulk GaN crystal by way of vapor growth process or melt growth process. However, GaN substrate of high quality and practical size is not yet realized.

As one approach of realizing a GaN substrate, there is proposed a GaN crystal growth method that uses Na as the flux in Chemistry of Materials vol. 9 (1997) 413-416. With this process, sodium azide ($NaN_3$) and metal Ga are confined in a reaction vessel of stainless steel (vessel dimension: inner diameter=7.5 mm; length=100 mm) as the source material, together with a nitrogen gas, and a GaN crystal is grown by holding the reaction vessel at a temperature of 600-800° C. for 24-100 hours.

According to this conventional method, it becomes possible to carry out the crystal growth at relatively low temperatures of 600-800° C. while maintaining the pressure inside the vessel to a relatively low pressure of 100 $kg/cm^2$ or less. This means that crystal growth can be conducted under a practical condition.

With this method, however, the crystal growth is made by confining sodium azide ($NaN_3$) and metal Ga source in the vessel, and it has been difficult to attain a large crystal size because of depletion of the source material.

The inventor of the present invention has made proposals in the past for solving these problems and achieved growth of large size crystal successfully.

Patent Reference 1 discloses the method of replenishing a group III metal at the time of growing the group III nitride crystal for achieving growth of large size group III nitride crystal.

With this method, a growth vessel and a supply line of group III metal are provided in a reaction vessel and a group III metal is replenished to the reaction vessel accommodating therein a flux, by applying a pressure to the supply line of the group III nitride from outside.

On the other hand, there is a problem of growth of junk crystals that prevents the growth of large size crystal. Thus, when nucleation is caused on the inner wall surface of the vessel holding the melt and growth of junk crystals takes place, the source material is consumed for the growth of such junk crystals. Thereby, it becomes necessary to provide the source material with the amount beyond the amount actually needed for growing the desired crystal. Further, because of decrease of efficiency of supply of the source material, it takes a long time for growing a crystal of the desired large size.

Patent Reference 2 discloses a method of conducting crystal growth by locally heating a seed crystal.

According to this method, the seed crystal and a part of the melt in the vicinity of the seed crystal alone are heated to a temperature capable of causing crystal growth while holding other parts of the melt to a temperature in which there occurs no crystal growth. With this, natural nucleation is suppressed on the inner wall surface of the crucible, and crystal growth proceeds efficiently only on the seed crystal.

However, dissolution of nitrogen from vapor phase into the melt depends on the temperature and also on the area of the vapor-liquid interface, and thus, there has been a concern, with such a process that uses local heating and the region of high temperature is limited as a consequence, that low grade crystals containing large amount of nitrogen defects may grow because of limited dissolution of nitrogen.

Further, it should be noted that, when a seed crystal growth is conducted by heating the entirety of the melt and dissolving nitrogen into the melt from the vapor phase, there arises a problem that low grade crystals grow in the initial phase of crystal growth when the seed crystal is held in the melt from the beginning. It should be noted that this is caused because the crystal growth is commenced before the nitrogen concentration in the melt has reached the concentration sufficient for causing growth of high-quality crystal. When the seed crystal is contacted after the nitrogen concentration has increased sufficiently for avoiding this problem, on the other hand, there arises a problem that crystal nuclei are formed also on the inner wall surface of the reaction vessel depending on the condition, while this leads to growth of the junk crystals.

Conventionally, the inventor of the present invention has succeeded in the growth of large crystal of high quality by suppressing the growth of junk crystals on the inner wall surface of the melt holding vessel, by choosing the crystal growth condition appropriately.

However, it is needless to say that further improvement of crystal quality may be attained by increasing the degree of freedom in the growth condition.

The present invention has been made under such a situation and it is the object of the present invention to provide a manufacturing method of a large group III nitride crystal of high quality in short time when conducting a seed crystal growth in a state a seed crystal is held in a melt, by successfully suppressing the growth of crystals of poor quality.

The present invention has been made under such a situation and it is the object of the present invention to provide a manufacturing method and apparatus of a group III nitride crystal capable of growing a high-quality seed crystal to a large size with shorter duration.

Patent Reference 1
Japanese Laid-Open Patent Application 2001-058900 Official Gazette
Patent Reference 2
Japanese Laid-Open Patent Application 2002-058900 Official Gazette In a first aspect, the present invention provides a manufacturing method of a group III nitride crystal that grows a seed crystal in a holding vessel holding a melt containing a group III metal and an alkali metal, comprising the steps of:
contacting said seed crystal with said melt;
setting an environment of said seed crystal to a first state offset from a crystal growth condition in a state in which said seed crystal is contacted to said melt;
increasing a nitrogen concentration in said melt; and
setting said environment of said seed crystal to a second state suitable for crystal growth when said nitrogen concentration of said melt has reached a concentration suitable for causing crystal growth of said seed crystal.

According to the present invention, the seed crystal is contacted to the melt at the time of growing the seed crystal in a holding vessel holding a melt of the group III metal, the alkali metal and nitrogen, and the environment of the seed crystal is set to the first state offset from the crystal growth condition in this state. Further, when the nitrogen concentration in the melt has increased and reached a concentration suitable for growing a seed crystal, the environment of the seed crystal is set to a second state suitable for conducting crystal growth. Because the nitrogen concentration in the melt has not increased to the degree that there is caused nucleation of multiple nuclei, the problem of precipitation of microcrystals on the inner wall surface of the holding vessel is suppressed. As a result, waste of the source material is prevented, and it becomes possible to manufacture a bulk crystal of a group III nitride efficiently. In other words, it becomes possible to grow a large group III nitride crystal of high quality with shorter duration as compared with the conventional art by suppressing the growth of low-quality crystals when conducting growth of a seed crystal in the state the seed crystal is held in a melt.

In a second aspect, the present invention provides a method of manufacturing a group III nitride crystal in a holding vessel holding a melt containing a group III metal, an alkali metal and nitrogen, comprising the step of:
holding a temperature of said holding vessel to be equal to or higher than a temperature of said melt.

According to the present invention, the temperature of the holding vessel is maintained, when growing a group III nitride crystal in a holding vessel holding a melt containing a group III melt, an alkali metal and nitrogen, at a temperature higher than the temperature of the melt. With this, heat of formation at the time of formation of the crystal nuclei is not dissipated from the inner wall surface of the holding vessel, and precipitation of unnecessary microcrystals at the inner wall surface of the holding vessel is suppressed. Thus, waste of the source material is suppressed, and it becomes possible to grow a large group III nitride crystal with duration shorter than in the conventional art.

In a third aspect, the present invention provides a crystal growth apparatus comprising:
a holding vessel holding a melt containing a group III metal, an alkali metal and nitrogen;
a heating unit heating the holding vessel directly;
a supply mechanism supplying nitrogen to said melt; and
a dipping mechanism contacting a seed crystal to said melt in said holding vessel.

According to the present invention, the holding vessel is heated directly by the heating unit and it becomes possible to maintain a temperature of the holding vessel to be equal to or higher than a temperature of the holding vessel, and there occurs no dissipation of the heat of formation from the inner wall surface of the holding vessel at the time of formation of the crystal nuclei. Thus, precipitation of junk crystals on the inner wall of the holding vessel is suppressed. Thus, waste of the source material is suppressed, and it becomes possible to grow a large group III nitride crystal of high quality with duration shorter than in the conventional art.

In a fourth aspect, the present invention provides a crystal growth apparatus of a group III nitride crystal comprising:
a holding vessel holding a metal containing a group III metal, an alkali metal and nitrogen;
an auxiliary vessel accommodating therein said holding vessel;
a heating unit heating the auxiliary vessel; and
a supply mechanism supplying nitrogen to said melt.

According to the present invention, the holding vessel holding the melt is accommodated in the auxiliary vessel and is heated by a heater disposed outside the auxiliary vessel. Thus, heat is transmitted from the auxiliary vessel to the holding vessel and further to the melt. In this case, it should be noted that the holding vessel has a temperature higher than the melt, and there occurs no dissipation of heat of formation from the inner wall of the holding vessel at the time of formation of the crystal nuclei. Thus, precipitation of junk crystals on the inner wall surface of the holding vessel is suppressed. Thus, waste of the source material is suppressed, and it becomes possible to grow a large group III nitride crystal with duration shorter than in the conventional art.

In a fifth aspect, the present invention provides a method of manufacturing a group III nitride crystal in a holding vessel holding a melt containing a group III metal, an alkali metal and nitrogen, comprising the steps of:

contacting a seed crystal to said melt when a nitrogen concentration in said melt has stabilized; and growing said seed crystal.

According to the present invention, the seed crystal is contacted to the melt, when growing a group III nitride crystal in a holding vessel holding a melt containing a group III melt, an alkali metal and nitrogen, after the nitrogen concentration in the melt has been stabilized. In the state the nitrogen concentration in the melt has been stabilized, a crystal growth proceeds rather than a nucleation process, and there occurs no formation of polycrystal body as a result of formation of new crystal nuclei on the seed crystal. With this, it becomes possible to grow the seed crystal. Thus, it becomes possible to grow the seed crystal to a large size with high quality in the duration shorter than in the conventional art.

In a sixth aspect, the present invention provides a crystal growth apparatus comprising:

a holding vessel holding a melt containing a group III metal, an alkali metal and nitrogen;

a heating unit heating the holding vessel;

a supply mechanism supplying nitrogen to said melt;

a dipping mechanism contacting a seed crystal to said melt in said holding vessel; and a growth blocking member disposed in the vicinity of an inner wall of said holding vessel for blocking crystal growth of minute crystals precipitated on said inner wall surface of said holding vessel.

According to the present invention, crystal growth of the minute crystals precipitated on the inner wall surface of the holding vessel is suppressed by the growth blocking member. With this, growth of junk crystals is suppressed. As a result, it becomes possible to grow the seed crystal to a large size with high quality in the duration shorter than in the conventional art.

In a seventh aspect, the present invention provides a crystal growth apparatus comprising:

a fixed auxiliary vessel holding a melt containing a group III metal, an alkali metal and nitrogen;

a holding vessel accommodated in said fixed auxiliary vessel, an entirety of said holding vessel being dipped into said melt in said fixed auxiliary vessel;

a heating unit heating said fixed auxiliary vessel;

a supply mechanism supplying nitrogen to said melt; and a dipping mechanism pulling up said holding vessel out from said fixed auxiliary vessel and causing a seed crystal to make a contact with said melt in said holding vessel.

According to the present invention, it becomes possible to prevent wasting of the source material caused with growth of the junk crystals and it becomes possible to use the majority of the source material for the growth of the seed crystal. Thus, it becomes possible to grow the seed crystal to a large size with high quality in the duration shorter than in the conventional art.

In an eighth aspect, the present invention provides a crystal growth apparatus of a group III nitride crystal, comprising:

a movable auxiliary vessel holding a melt of a group III metal, an alkali metal and nitrogen;

a holding vessel accommodating said movable auxiliary vessel therein;

a heating unit heating said holding vessel;

a supply mechanism supplying nitrogen to said melt;

a taking out unit taking out said movable auxiliary vessel out from said holding vessel and moving said melt in said movable auxiliary vessel into said holding vessel; and a dipping mechanism causing a seed crystal to make a contact with said melt moved to said holding vessel.

According to the present invention, it becomes possible to prevent wasting of the source material caused with growth of the junk crystals and it becomes possible to use the majority of the source material for the growth of the seed crystal. Thus, it becomes possible to grow the seed crystal to a large size with high quality in the duration shorter than in the conventional art.

In a ninth aspect, the present invention provides a crystal growth apparatus comprising: a holding vessel holding a melt containing a group III metal, an alkali metal and nitrogen;

a heating unit heating the holding vessel;

a supply mechanism supplying nitrogen to said melt;

a dipping mechanism contacting a seed crystal to said melt in said holding vessel; and a removing mechanism removing microcrystals precipitated on the inner wall surface of said holding vessel.

According to the present invention, it becomes possible to prevent wasting of the source material caused with growth of the junk crystals and it becomes possible to use the majority of the source material for the growth of the seed crystal. Thus, it becomes possible to grow the seed crystal to a large size with high quality in the duration shorter than in the conventional art.

According to the manufacturing method of group III nitride crystal of the present invention, it becomes possible to grow a large group III nitride crystal of high quality with shorter duration as compared with the conventional art by suppressing the growth of low-quality crystals when conducting growth of a seed crystal in the state the seed crystal is held in a melt.

Further, according to the manufacturing method of the present invention, it becomes possible to grow a crystal of group III nitride of large size with shorter duration as compared with the conventional art, and it becomes possible to grow a large group III nitride crystal with shorter duration as compared with the conventional art.

Further according to the present invention, it becomes possible to grow the seed crystal to a large size with high quality in the duration shorter than in the conventional art.

BEST MODE FOR IMPLEMENTING THE INVENTION

Figure 1:
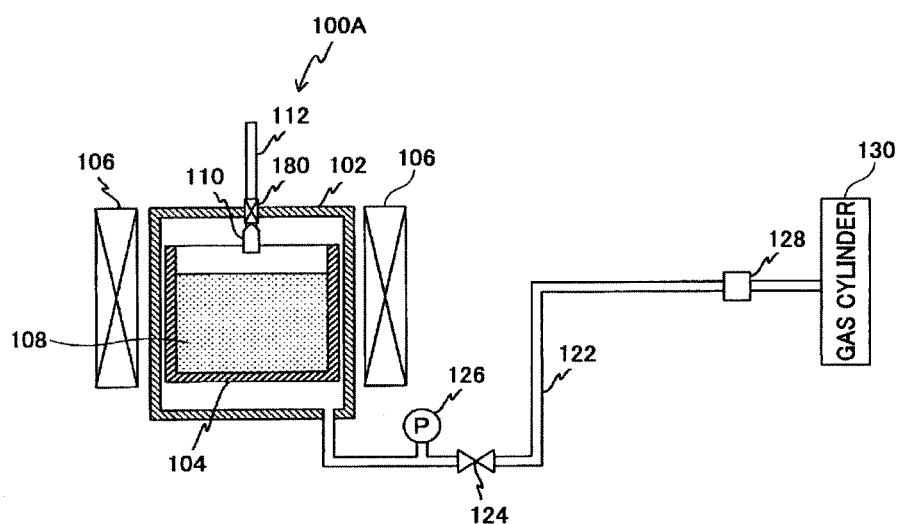
FIG. 1 is a diagram for explaining a general construction of a manufacturing apparatus for implementing a manufacturing method of a GaN crystal according to a first embodiment of the present invention.

Hereinafter, the present invention will be described in detail for embodiments with reference to the drawings. In the drawings, those parts explained before are designated by the same reference numerals and the description thereof will be omitted.

First Embodiment

Hereinafter, a first embodiment of the present invention will be described based on FIG. 1.

FIG. 1 shows a schematic constructional of a manufacturing apparatus 100A used for implementing a manufacturing method of group III nitride crystal according to the first embodiment of the present invention.

Referring to FIG. 1, the manufacturing apparatus 100A is an apparatus growing a bulk GaN by a flux process and is constructed by a reaction vessel 102, a melt holding vessel 104, a heater 106, a heater 180, a seed crystal holder 112 holding a seed crystal 110, a gas supply line 122, a valve 124, a pressure meter 126, a pressure regulator 128, a gas cylinder 130, and the like.

The reaction vessel 102 is a vessel of stainless steel having a closed form. In this reaction vessel 102, there is provided a melt holding vessel 104.

The seed crystal holder 112 can move the seed crystal 110 up and down without opening the reaction vessel 102.

The melt holding vessel 104 is formed of P-BN (pyrolytic boron nitride) and can be taken out from the reaction vessel 102. The melt holding vessel 104 is loaded with a melt 108 containing sodium (Na) as an alkali metal and metal gallium (Ga) as a group III metal.

The heater 106 is provided outside of the reaction vessel 102 adjacent thereto. Thus, the melt holding vessel 104 is heated via the reaction vessel 102.

The heater 180 is mounted in the vicinity of a part of the seed crystal holder 112 in which the seed crystal 110 is held and can heat the seed crystal 110 without opening the reaction vessel 102.

The gas supply line 122 is a conduit for supplying a nitrogen ($N_2$) gas into the reaction vessel 102 and is provided between the reaction vessel 102 and the nitrogen gas cylinder 130.

The valve 124 is provided on the gas supply line 122 in the part close to the reaction vessel 102. When the valve 124 is open, the nitrogen gas is supplied to the reaction vessel 102, while when the valve 124 is closed, the supply of the nitrogen gas to the reaction vessel 102 is shutdown. Further, the gas supply line 122 can be disconnected at a front side (the side closer to the nitrogen gas cylinder 130) of the valve 124. With this, it becomes possible to work on the reaction vessel 102 by moving the reaction vessel 102 into a glove box.

The pressure regulator 128 is provided on the gas supply line 122 in the part close to the nitrogen gas cylinder 130 and is used for regulating the pressure of the nitrogen gas supplied into the reaction vessel 102.

The pressure meter 126 is provided on the gas supply line 122 in the part between the valve 124 and the reaction vessel 102 and is used for monitoring the pressure of the nitrogen gas supplied into the reaction vessel 102.

Next, the manufacturing method of a GaN crystal conducted by the manufacturing apparatus 100A of the construction noted above will be explained.

(1) Disconnect the gas supply line 122 at the front side of the valve 124 and set the reaction vessel 102 into a glove box of an argon (Ar) gas ambient.

(2) Take out the melt holding vessel 104 from the reaction vessel 102 and load a melt 108 containing source Ga and flux Na into the melt holding vessel 104. In the present example, the ratio of Na or Na/(Na+Ga) in the melt 108 is set to 0.4 (Na/(Na+Ga)=0.4).

(3) Accommodate the melt holding vessel 104 into the reaction vessel 102 and set to a predetermined position.

(4) Attach a columnar GaN crystal of a length of about 5 mm in c-axis direction on the seed crystal holder 112 as a seed crystal 110.

(5) Close the lid of the reaction vessel 102.

(6) Close the valve 124 and disconnect the reaction vessel 102 from outside.

(7) Take out the reaction vessel 102 from the glove box and connect the gas supply line 122 at the front side of the valve 124.

(8) Open the valve 124 and supply the nitrogen gas into the reaction vessel 102. Here, the pressure of the nitrogen gas is set to 2.5 MPa by using the pressure regulator 128. This pressure is a pressure chosen such that the pressure inside the reaction vessel 102 becomes 5 MPa when the melt 108 has reached the crystal growth temperature. Here, a crystal growth temperature of 800° C. is used.

(9) Close the valve 124. With this, the reaction vessel 124 is in a hermetically sealed state.

(10) Energize the heater 106 and raise the temperature of the melt 108 from room temperature (27° C.) to the crystal growth temperature (800° C.) in about one hour. With increase of the temperature, the pressure inside the closed reaction vessel 102 is increased and the total pressure inside the reaction vessel 102 reaches 5 MPa when the crystal growth temperature (800° C.) has been reached. Thereafter, the pressure of the pressure regulator 128 is set to 5 MPa and the valve 124 is opened.

(11) Energize the heater 180 and heat the seed crystal 110 to a temperature of 810° C., which exceeds the temperature of the seed crystal 110.

(12) Lower the seed crystal 110 by operating the seed crystal holder 112 such that the seed crystal 110 is contacted with the melt 108 or dipped into the melt 108.

Figure 2:
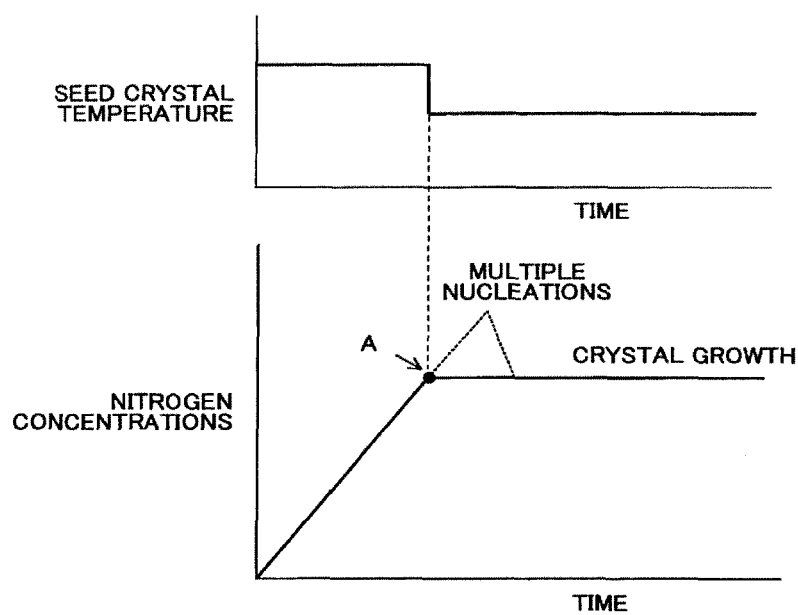
FIG. 2 is a diagram for explaining the manufacturing method of the GaN crystal by using the manufacturing apparatus of FIG. 1.

(13) Hold this state for about 20 hours. Because the temperature of the seed crystal 110 is higher than the temperature of the melt 108, the environment of the seed crystal 110 is offset from the crystal growth condition, and thus, there occurs little crystal growth in this state. Thus, there is caused increase of nitrogen concentration in the melt 108 with time as shown in FIG. 2, wherein FIG. 2 shows an example of such increase of nitrogen concentration in the melt 108 with time. After about 20 hours, the nitrogen concentration in the melt 108 reaches the concentration suitable for crystal growth. Here, it should be noted that this holding duration is determined in advance by experiment as the duration needed for the nitrogen concentration in the melt 108 to reach the concentration suitable for crystal growth.

(14) Stop the energization of the heater 180. With this, the temperature of the seed crystal 110 is lowered below the temperature of the melt 108 in the event there is caused escaping of heat via the seed crystal holder 112. In the case there occurs no escaping of heat via the seed crystal holder 12, the temperature of the seed crystal 110 becomes identical to the temperature of the melt 108. Thus, by stopping the energization of the heater 1280, the temperature of the seed crystal 110 lowers to a temperature equal to or lower than the temperature of the melt 108. Now, when the temperature of the seed crystal 110 has become equal to or lower than the temperature of the melt 108, there occurs increase in the degree of supersaturation in the vicinity of the seed crystal 110 and the environment of the seed crystal 110 reaches a condition suitable for the crystal growth. Thereby, there is started the crystal growth of the GaN crystal from the seed crystal 110.

(15) Hold this state for about 300 hours.

(16) Pull up the seed crystal 110 on which the crystal growth has been made from the melt 108 after about 300 hours by operating the seed crystal holder 112.

(17) Stop the energization of the heater 106.

When the reaction vessel 102 was opened after cooling, it was observed that there occurred no substantial precipitation of junk crystals on the inner wall surface of the melt holding vessel 104 and that the seed crystal 110 was grown to have a length of about 10 mm in the c-axis direction.

As explained above, the temperature of the seed crystal 110 in the melt 108 is set higher than the temperature of the melt 108 with the first embodiment of the present invention as shown in the example of FIG. 2, wherein the temperature of the seed crystal 110 is lowered at a timing shown in FIG. 2 by an arrow A, wherein this timing A is before the occurrence of multiple nucleation and corresponds to the timing when the nitrogen concentration in the melt 108 has reached the concentration suitable for growth of high-quality crystals. With this, the nitrogen concentration in the melt 108 becomes constant and does not increase to the degree that there occurs multiple nucleation. Thus, precipitation of junk crystals in the inner wall surface of the melt holding vessel 104 is suppressed, and it becomes possible to use the majority of the source material for the crystal growth of the GaN crystal from the junk crystals 110. As a result, it becomes possible to manufacture a bulk crystal of GaN, a group III nitride, efficiently. Thus, it becomes possible to grow a large GaN crystal of high quality with shorter duration as compared with the conventional art by suppressing the growth of low-quality crystals when conducting growth of a seed crystal in the state the seed crystal is held in a melt.

First Embodiment

Next, a second embodiment of the present invention will be described.

It should be noted that this second embodiment has the feature of using different temperature and pressure as compared with the first embodiment explained before. Thus, the present embodiment uses the same growth apparatus 100A used with the first embodiment for the growth apparatus. Hereinafter, explanation will be made mainly on the difference over the first embodiment. Thereby, it should be noted that the same reference numerals are used for the parts identical to or equivalent to the parts of the first embodiment and the description thereof will be simplified or omitted.

(1) Disconnect the gas supply line 122 at the front side of the valve 124 and set the reaction vessel 102 into a glove box of an argon (Ar) gas ambient.

(2) Take out the melt holding vessel 104 from the reaction vessel 102 and load a melt 108 containing source Ga and flux Na into the melt holding vessel 104. In the present example, the ratio of Na or Na/(Na+Ga) in the melt 108 is set to 0.4 (Na/(Na+Ga)=0.4).

(3) Accommodate the melt holding vessel 104 into the reaction vessel 102 and set to a predetermined position.

(4) Attach a columnar GaN crystal of a length of about 5 mm in c-axis direction on the seed crystal holder 112 as a seed crystal 110.

(5) Close the lid of the reaction vessel 102.

(6) Close the valve 124 and disconnect the reaction vessel 102 from outside.

(7) Take out the reaction vessel 102 from the glove box and connect the gas supply line 122 at the front side of the valve 124.

(8) Open the valve 124 and supply the nitrogen gas into the reaction vessel 102. Here, the pressure of the nitrogen gas is set to 3 MPa by using the pressure regulator 128. This pressure is a pressure chosen such that the pressure inside the reaction vessel 102 becomes 7 MPa when the melt 108 has reached the crystal growth temperature. In the present embodiment, the crystal growth temperature of 850° C. is used, wherein this crystal growth temperature is higher than the crystal growth temperature used in the first embodiment.

(9) Close the valve 124. With this, the reaction vessel 124 is in a hermetically sealed state.

(10) Energize the heater 106 and raise the temperature of the melt 108 from room temperature (27° C.) to the crystal growth temperature (850° C.) in about one hour. With increase of the temperature, the pressure inside the closed reaction vessel 102 is increased and the total pressure inside the reaction vessel 102 reaches 7 MPa when the crystal growth temperature (850° C.) has been reached. Thereafter, the pressure of the pressure regulator is set to 7 MPa and the valve 124 is opened.

(11) Energize the heater 180 and heat the seed crystal 110 to a temperature of 860° C., which exceeds the temperature of the seed crystal 110.

(12) Lower the seed crystal 110 by operating the seed crystal holder 112 such that the seed crystal 110 is contacted with the melt 108 or dipped into the melt 108.

(13) Hold this state for about 10 hours. Because the temperature of the seed crystal 110 is higher than the temperature of the melt 108 in this state, there occurs no crystal growth. Further, there occurs increase of nitrogen concentration in the melt 108 with time. Here, it should be noted that this holding duration is determined in advance by experiment as the duration needed for the nitrogen concentration in the melt 108 to reach the concentration suitable for crystal growth. Because the present embodiment uses a crystal growth temperature higher than the crystal growth temperature of the first embodiment, the holding duration of the present embodiment becomes shorter than in the case of the first embodiment.

(14) Stop the energization of the heater 180. With this, the temperature of the seed crystal 110 is lowered. When the temperature of the seed crystal 110 has become generally equal to the temperature of the melt, the crystal growth of the GaN crystal from the seed crystal 110 is started.

(15) Hold this state for about 50 hours. It should be noted that the holding time is shorter than in the case of the first embodiment in view of the higher crystal growth temperature.

(16) Pull up the seed crystal 110 on which the crystal growth has been made from the melt 108 after about 150 hours by operating the seed crystal holder 112.

(17) Stop the energization of the heater 106.

When the reaction vessel 102 was opened after cooling, it was observed that there occurred no substantial precipitation of junk crystals on the inner wall surface of the melt holding vessel 104 and it was also observed that the seed crystal 110 was grown to have a length of about 10 mm in the c-axis direction.

As explained heretofore, it becomes possible to obtain a GaN crystal similar to the one obtained with the first embodiment in the present embodiment with the duration shorter than the duration of the first embodiment. Thus, it becomes possible to grow a large GaN crystal of high quality with shorter duration as compared with the conventional art by suppressing the growth of low-quality crystals when conducting growth of a seed crystal in the state the seed crystal is held in a melt.

Third Embodiment

Next, a third embodiment of the present invention will be described with reference to FIG. 3.

Figure 3:
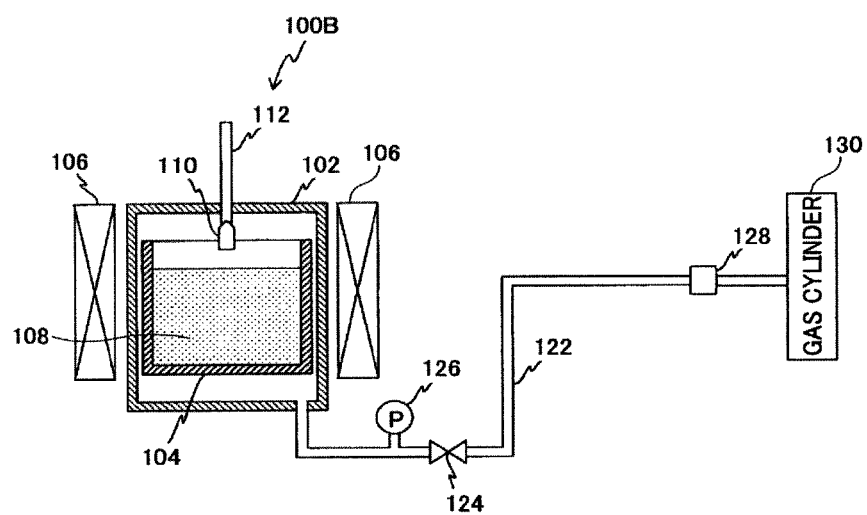
FIG. 3 is a diagram for explaining a general construction of a manufacturing apparatus for implementing a manufacturing method of a GaN crystal according to a third embodiment of the present invention.

FIG. 3 shows a schematic constructional of a manufacturing apparatus 100B used for implementing a manufacturing method of group III nitride crystal according to the third embodiment of the present invention.

Referring to FIG. 3, the manufacturing apparatus 100B has a construction similar to that of the first embodiment except that the heater 180 is eliminated. Hereinafter, explanation will be made mainly on the difference over the first embodiment. Thereby, it should be noted that the same reference numerals are used for the parts identical to or equivalent to the parts of the first embodiment and the description thereof will be simplified or omitted.

Next, the manufacturing method of a GaN crystal conducted by the manufacturing apparatus 100B of the construction noted above will be explained with reference to FIGS. 4A and 4B.

(1) Disconnect the gas supply line 122 is disconnected at the front side of the valve 124 and set the reaction vessel 102 into a glove box of an argon (Ar) gas ambient.

(2) Take out the melt holding vessel 104 from the reaction vessel 102 and load a melt 108 containing source Ga and flux Na into the melt holding vessel 104. In the present example, the ratio of Na or Na/(Na+Ga) in the melt 108 is set to 0.4 (Na/(Na+Ga)=0.4).

(3) Accommodate the melt holding vessel 104 into the reaction vessel 102 and set to a predetermined position.

(4) Attach a columnar GaN crystal of a length of about 5 mm in c-axis direction on the seed crystal holder 112 as a seed crystal 110.

Figure 4A:
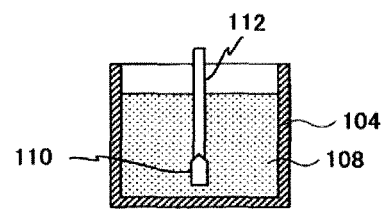
FIG. 4A is a first diagram for explaining the manufacturing method of the GaN crystal by using the manufacturing apparatus of FIG. 3.

(5) Lower the seed crystal 110 by operating the seed crystal holder 112 as shown in the example of FIG. 4A such that the seed crystal 110 is held at a lower part of the melt 108. Because nitrogen dissolves into the melt 108 from a melt surface thereof, lower part of the melt 108 has a low nitrogen concentration. Thus, the seed crystal 110 is held in the region of the melt where the nitrogen concentration is low. Because the seed crystal 110 is in the environment offset from the crystal growth condition, there occurs little crystal growth in this region.

(6) Close the lid of the reaction vessel 102.

(7) Close the valve 124 and disconnect the reaction vessel 102 from outside.

(8) Take out the reaction vessel 102 from the glove box and connect the gas supply line 122 at the front side of the valve 124.

(9) Open the valve 129 and supply the nitrogen gas into the reaction vessel 102. Here, the pressure of the nitrogen gas is set to 2.5 MPa by using the pressure regulator 128. This pressure is a pressure chosen such that the pressure inside the reaction vessel 102 becomes 5 MPa when the melt 108 has reached the crystal growth temperature. Here, a crystal growth temperature of 800° C. is used.

(10) Close the valve 124. With this, the reaction vessel 124 is in a hermetically sealed state.

(11) Energize the heater 106 and raise the temperature of the melt 108 from room temperature (27° C.) to the crystal growth temperature (800° C.) in about one hour. With increase of the temperature, the pressure inside the closed reaction vessel 102 is increased and the total pressure inside the reaction vessel 102 reaches 5 MPa when the crystal growth temperature (800° C.) has been reached. Thereafter, the pressure of the pressure regulator 128 is set to 5 MPa and the valve 124 is opened.

(12) Hold this state for about 20 hours. With this, there occurs increase of nitrogen concentration in the melt 108 with time. Here, it should be noted that this holding duration is determined in advance by experiment as the duration needed for the nitrogen concentration in the melt 108 to reach the concentration suitable for crystal growth of high quality crystal in the upper part thereof.

Figure 4B:
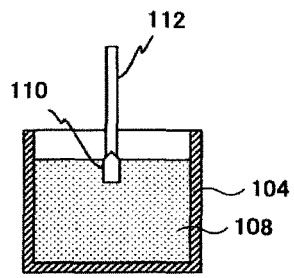
FIG. 4B is a second diagram for explaining the manufacturing method of the GaN crystal by using the manufacturing apparatus of FIG. 3.

(13) As an example, the seed crystal 110 is moved upward by operating the seed crystal holder 112 as shown in FIG. 4B such that the seed crystal 110 is held moved to the upper part of the melt 108. Thus, the seed crystal 110 is moved to the region of the melt where the nitrogen concentration is high. Because the environment of the seed crystal 110 is suitable for growing high-quality crystal in such a region, the crystal growth of GaN crystal is started from the seed crystal 110.

(14) Hold the state of FIG. 4B for about 300 hours.

(15) Pull up the seed crystal 110 on which the crystal growth has been made from the melt 108 after the foregoing duration about 300 hours has elapsed by operating the seed crystal holder 112.

(16) Stop the energization of the heater 106.

When the reaction vessel 102 was opened after cooling, it was observed that the seed crystal 110 was grown to have a length of about 10 mm in the c-axis direction similarly to the case of the first embodiment.

Thus, as explained before, the third embodiment of the present invention holds the seed crystal 110 in the lower part of the melt 10 when the nitrogen concentration in the melt 108 is lower than the concentration suitable for crystal growth and moves the seed crystal 110 to the upper part of the melt 108 with the timing that the nitrogen concentration has reached a concentration suitable for crystal growth in the upper part of the melt 108. With this, the nitrogen concentration in the melt 108 becomes constant and does not increase to the degree that there occurs multiple nucleation. Thus, precipitation of junk crystals in the inner wall surface of the melt holding vessel 104 is suppressed, and it becomes possible to use the majority of the source material for the crystal growth of the GaN crystal from the seed crystals 110. As a result, it becomes possible to manufacture a bulk crystal of GaN, a group III nitride, efficiently. Thus, it becomes possible to grow a large GaN crystal of high quality with shorter duration as compared with the conventional art by suppressing the growth of low-quality crystals when conducting growth of a seed crystal in the state the seed crystal is held in a melt.

Further, according to each of the embodiments noted before, the nitrogen concentration in the melt 108 is controlled by the nitrogen pressure in the ambient in contact with the melt 108 at the vapor-melt interface and the temperature of the melt 108.

Further, while the explanation has been made heretofore for the case of using the manufacturing apparatus of GaN crystal for the manufacturing apparatus of group III nitride crystal, the present invention is not limited to this and the nitride crystal may be a nitride crystal of a group III metal other than Ga.

Further, it is also possible to use an alkali metal other than Na for the flux.

Fourth Embodiment

Figure 5:
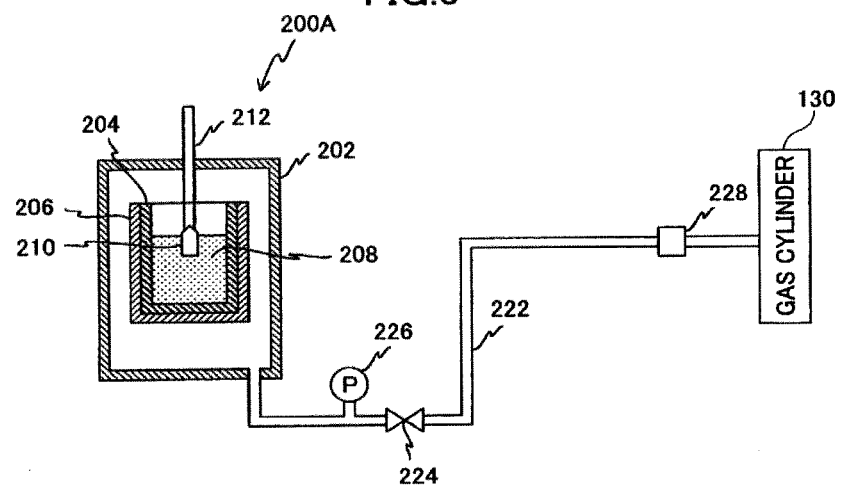
FIG. 5 is a diagram for explaining a general construction of a manufacturing apparatus for implementing a manufacturing method of a GaN crystal according to a fourth embodiment of the present invention.

Hereinafter, a fourth embodiment of the present invention will be described based on FIG. 5. FIG. 5 shows a schematic construction of a manufacturing apparatus 200A of a GaN crystal as an example of the manufacturing apparatus of group III nitride crystal according to the fourth embodiment of the present invention.

Referring to FIG. 5, the manufacturing apparatus 200A is an apparatus growing a bulk GaN by a flux process and includes a reaction vessel 202, a melt holding vessel 204 forming a holding vessel, a heater 206 forming a heating unit, a seed crystal holder 212 holding a seed crystal 110, a gas supply line 222, a valve 224, a pressure meter 226, a pressure regulator 228, and the like.

The reaction vessel 202 is a vessel of stainless steel having a closed form. In this reaction vessel 202, the melt holding vessel 204 is accommodated together with the heater 206.

The seed crystal holder 212 can move the seed crystal 210 up and down without opening the reaction vessel 202.

The melt holding vessel 204 is formed of P-BN (pyrolytic boron nitride) and can be taken out from the reaction vessel 202. The melt holding vessel 204 is loaded with a melt 208 containing sodium (Na) as an alkali metal and metal gallium (Ga) as a group III metal.

The heater 206 has a cylindrical form and can accommodate the melt holding part 204 therein. Because the entire wall of the melt holding vessel 204 is heated directly by the heater 206, it becomes possible to prevent the heat dissipation caused through the wall of the melt holding vessel 204. Thus, there always holds the relationship T2≥T3, between the temperature of the wall of the melt holding vessel 204 (designated as T2) and the temperature of the melt 208 (designated as T3). The temperature of the seed crystal 210 (designated as T1) is lower than the temperature of the melt 208 in the case it is not contacted to or dipped into the melt 208. When the melt 210 is contacted to or dipped into the melt 208, the heat from the melt 208 causes increase of temperature of the seed crystal 210, while there still holds the relationship T2≥T3≥T1 during the crystal growth process of GaN because of transmission of the heat to the seed holder 212.

The gas supply line 222 is a conduit for supplying a nitrogen (N₂) gas into the reaction vessel 202 and is provided between the reaction vessel 202 and the nitrogen gas cylinder 130.

The valve 224 is provided on the gas supply line 222 in the part close to the reaction vessel 202. When the valve 224 is open, the nitrogen gas is supplied to the reaction vessel 202, while when the valve 124 is closed, the supply of the nitrogen gas to the reaction vessel 202 is shutdown. Further, the gas supply line 222 can be disconnected at a front side (the side closer to the nitrogen gas cylinder 130) of the valve 224. With this, it becomes possible to work on the reaction vessel 202 by moving the reaction vessel 102 into a glove box.

The pressure regulator 228 is provided on the gas supply line 222 in the part close to the nitrogen gas cylinder 130 and is used for regulating the pressure of the nitrogen gas supplied into the reaction vessel 202.

The pressure meter 226 is provided on the gas supply line 222 in the part between the valve 224 and the reaction vessel 202 and is used for monitoring the pressure of the nitrogen gas supplied into the reaction vessel 202.

Next, the manufacturing method of a GaN crystal conducted by the manufacturing apparatus 200A of the construction noted above will be explained.

(1) Disconnect the gas supply line 222 at the front side of the valve 224 and set the reaction vessel 202 into a glove box of an argon (Ar) gas ambient.

(2) Take out the melt holding vessel 204 from the reaction vessel 202 and load a melt 208 containing source Ga and flux Na into the melt holding vessel 204. In the present example, the ratio of Na or Na/(Na+Ga) in the melt 208 is set to 0.4 (Na/(Na+Ga)=0.4).

(3) Accommodate the melt holding vessel 204 into the heater 206 disposed in the reaction vessel 202.

(4) Attach a GaN crystal of columnar shape having a length in c-axis direction of about 5 mm on the seed crystal holder 212 as a seed crystal 210.

(5) Close the lid of the reaction vessel 202.

(6) Close the valve 224 and disconnect the reaction vessel 202 from outside.

(7) Take out the reaction vessel 202 from the glove box and connect the gas supply line 222 at the front side of the valve 224.

(8) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(9) Close the valve 224. With this, the reaction vessel 224 is in a hermetically sealed state.

(10) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(11) Hold this state for about 10 hours and causes nitrogen to be dissolved into the melt and increase the nitrogen concentration in the melt to a concentration suitable for crystal growth. It should be noted that this duration is a value already measured by experiment.

(12) Lower the seed crystal 210 by operating the seed crystal holder 212 such that the seed crystal 210 is contacted with the melt 208 or dipped into the melt 108 (so-called seeding). With this, crystal growth of the seed crystal 210 is started.

(13) Hold this state for about 300 hours. During this interval, the temperature of the wall of the melt holding vessel 204 is equal to or higher than the temperature of the melt 208.

(14) Pull up the seed crystal 210 on which the crystal growth has been made from the melt 208 after the foregoing duration about 300 hours has elapsed by operating the seed crystal holder 212.

(15) Stop the energization of the heater 206.

When the reaction vessel 202 was opened after cooling, it was observed that there occurred no substantial precipitation of junk crystals on the inner wall surface of the melt holding vessel 204 and it was also observed that the seed crystal 210 was grown to have a length of about 10 mm in the c-axis direction.

As will be understood from the foregoing explanation, the manufacturing apparatus 200A of the present embodiment uses a seed crystal dipping mechanism formed by the seed crystal holder 212 and a nitrogen gas supply mechanism by the gas supply line 222, the valve 224, the pressure meter 226 and the pressure regulator 228.

As explained heretofore, according to the second embodiment, the crystal growth is conducted by heating the melt holding vessel 204 to a temperature equal to or higher than the temperature of the melt 208 and by contacting or dipping the seed crystal 210 of the temperature equal to or lower than the temperature of the melt 208, with or into the melt 208. Because there occurs no dissipation of the heat of formation at the time of the nucleation process from the inner wall surface of the melt holding vessel 204, and it becomes possible to suppress the nucleation of junk crystals on the inner wall surface of the melt holding vessel 204. Thus, it becomes possible to utilize the majority of source material for the growth of the seed crystal 210, and it becomes possible to achieve crystal growth of the seed crystal with high crystal quality and large size with the duration shorter than the duration in the conventional process.

Here, the duration of contact or dipping of the seed crystal 210 is not limited to 300 hours and can be changed according to the desired size of the GaN bulk crystal.

Fifth Embodiment

Next, a fifth embodiment of the present invention will be described with reference to FIGS. 6 and 7.

Figure 6:
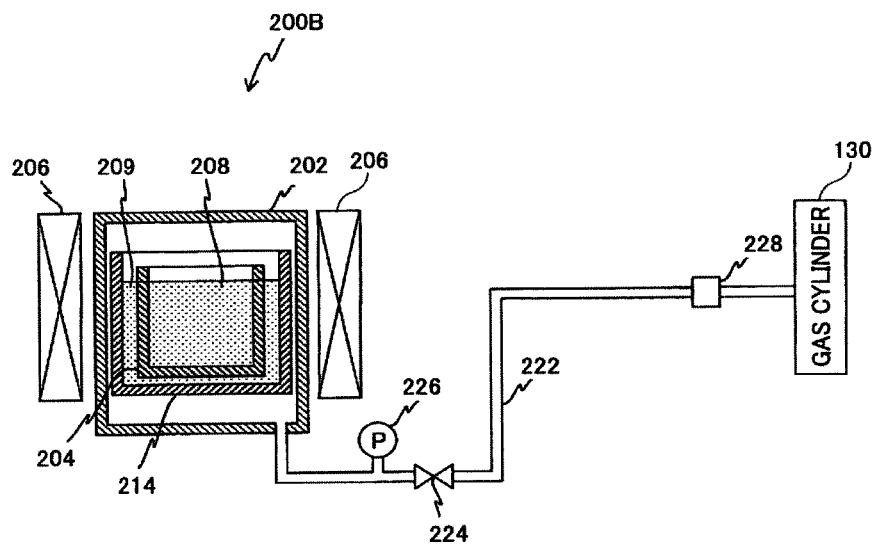
FIG. 6 is a diagram for explaining a general construction of a manufacturing apparatus for implementing a manufacturing method of a GaN crystal according to a fifth through eighth embodiments of the present invention.

FIG. 6 shows a schematic construction of a manufacturing apparatus 100B of a GaN crystal as an example of the manufacturing apparatus of group III nitride crystal according to the fifth embodiment of the present invention. Hereinafter, those parts identical or equivalent to the parts of the fourth embodiment described before are designated by the same reference numerals and the description thereof will be simplified or omitted.

Referring to FIG. 6, the manufacturing apparatus 200B is an apparatus growing a bulk GaN by a flux process and includes a reaction vessel 200, a melt holding vessel 204 forming a holding vessel, a heater 206 forming a heating unit, an auxiliary vessel 214, a gas supply line 222, a valve 224, a pressure meter 226, a pressure regulator 228, and the like.

The auxiliary vessel 214 is formed of P-BN and is accommodated into the reaction vessel 202. This auxiliary vessel 214 can be taken out from the reaction vessel 202.

The melt holding vessel 204 is formed of P-BN and is accommodated into the auxiliary vessel 214. This melt holding vessel 204 can be taken out from the auxiliary vessel 214. The melt holding vessel 204 is loaded with a melt 208 containing sodium (Na) as an alkali metal and metal gallium (Ga) as a group III metal.

The heater 206 is provided outside of the reaction vessel 202 adjacent thereto. Thus, the melt holding vessel 204 is heated via the reaction vessel 202 and the auxiliary vessel 214.

Next, the manufacturing method of a GaN crystal conducted by the manufacturing apparatus 200B of the construction noted above will be explained. Here, the crystal growth temperature is set to 800° C.

(1) Disconnect the gas supply line 222 at the front side of the valve 124 and set the reaction vessel 202 into a glove box of an argon (Ar) gas ambient.

(2) Take out the auxiliary vessel 214 and the melt holding vessel 204 from the reaction vessel 202.

(3) Load the melt 208 containing Ga forming the source and Na forming the flux into the melt holding vessel 204. In the present example, the ratio of Na or Na/(Na+Ga) in the melt 108 is set to 0.4 (Na/(Na+Ga)=0.4).

(4) Load indium into the auxiliary vessel 214 as the alkali metal.

(5) Set the melt holding vessel 204 in the auxiliary vessel 214.

(6) Accommodate the melt holding vessel 204 together with the auxiliary vessel 214 into the reaction vessel 202 and set to respective predetermined positions.

(7) Close the lid of the reaction vessel 202.

(8) Close the valve 224 and disconnect the reaction vessel 202 from outside.

(9) Take out the reaction vessel 202 from the glove box and connect the gas supply line 222 at the front side of the valve 224.

(10) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(11) Close the valve 224. With this, the reaction vessel 224 is in a hermetically sealed state.

(12) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(13) Hold this state for about 300 hours.

(14) After the duration of about 300 hours has passed, the energization of the heater 206 is stopped and the reaction vessel 202 is cooled. When the reaction vessel 202 was opened after the cooling, it was observed that there occurred no substantial precipitation of junk crystals on the inner wall surface of the melt holding vessel 204 and it was observed also that a GaN crystal 250 is grown with a size of about 5 mm in the c-axis direction at the bottom of the melt holding vessel 204.

As will be understood from the foregoing explanation, the manufacturing apparatus 200B of the present embodiment uses a nitrogen gas supply mechanism constructed by the gas supply line 222, the valve 224, the pressure meter 226 and the pressure regulator 228.

Figure 7:
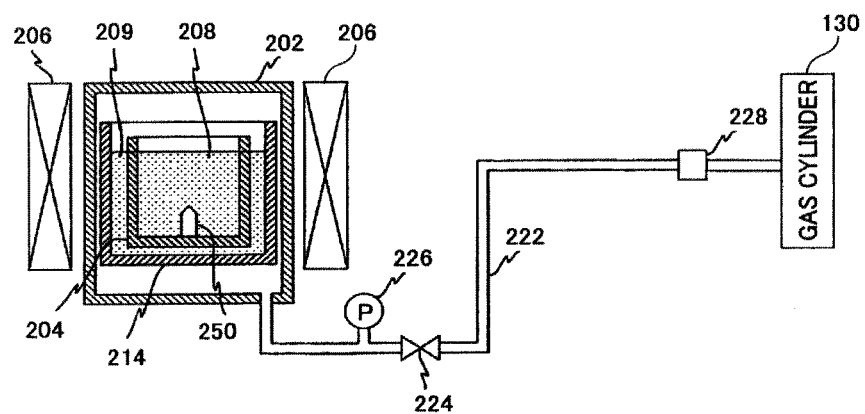
FIG. 7 is a diagram for explaining the manufacturing method with the manufacturing apparatus of FIG. 6.

As explained above, the melt holding vessel 204 is accommodated in the auxiliary vessel 214 containing indium as shown in the example of FIG. 7. Further, the melt 208 is heated via the auxiliary vessel 214, indium, and the melt holding vessel 204. With this, the melt holding vessel 204 is held at a temperature higher than the temperature of the melt 208 and there occurs no dissipation of the heat of formation at the time of formation of the crystal nuclei via the inner wall surface. Thus, it becomes possible to suppress the precipitation of unnecessary junk crystals (minute crystals) at the inner wall surface of the melt holding vessel 204. Thus, it becomes possible to utilize the majority of source material for the growth of the desired crystal, and it becomes possible to achieve the growth of large GaN crystal with the duration shorter than the duration in the conventional process.

Sixth Embodiment

Next, a sixth embodiment of the present invention will be described.

It should be noted that the present invention has the feature of using gallium in place of indium in the fifth embodiment. Thus, the present embodiment uses the same growth apparatus 200B used with the fifth embodiment for the growth apparatus. Hereinafter, explanation will be made mainly on the difference over the fifth embodiment. Thereby, it should be noted that the same reference numerals are used for the parts identical to or equivalent to the parts of the fifth embodiment and the description thereof will be simplified or omitted.

(1) Disconnect the gas supply line 222 at the front side of the valve 224 and set the reaction vessel 202 into a glove box of an argon (Ar) gas ambient.

(2) Take out the auxiliary vessel 214 and the melt holding vessel 204 from the reaction vessel 202.

(3) Load the melt 208 containing Ga forming the source and Na forming the flux into the melt holding vessel 204. In the present example, the ratio of Na or Na/(Na+Ga) in the melt 208 is set to 0.4 (Na/(Na+Ga)=0.4).

(4) Load gallium into the auxiliary vessel 214.

(5) Accommodate the melt holding vessel 204 into the auxiliary vessel 214.

(6) Dispose the melt holding vessel 204 and the auxiliary vessel 214 to the reaction vessel 202 and set to respective predetermined positions.

(7) Close the lid of the reaction vessel 202.

(8) Close the valve 224 and disconnect the reaction vessel 202 from outside.

(9) Take out the reaction vessel 202 from the glove box and connect the gas supply line 222 at the front side of the valve 224.

(10) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(11) Close the valve 224. With this, the reaction vessel 224 is in a hermetically sealed state.

(12) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(13) Hold this state for about 300 hours.

(14) After the duration of about 300 hours has passed, the energization of the heater 206 is stopped and the reaction vessel 202 is cooled.

When the reaction vessel 202 was opened after the cooling, it was observed that there occurred no substantial growth of junk crystals on the inner wall surface of the melt holding vessel 204 and it was observed also that a GaN crystal 250 is grown with a size of about 5 mm in the c-axis direction at the bottom of the melt holding vessel 204.

As explained heretofore, it becomes possible to obtain a GaN crystal similar to the one obtained in the fifth embodiment explained previously.

Seventh Embodiment

Next, a seventh embodiment of the present invention will be described.

It should be noted that this seventh embodiment has the feature of using gallium in place of indium used in the fifth embodiment described previously. Thus, the present embodiment uses the same growth apparatus 200B used with the fifth embodiment for the growth apparatus. Hereinafter, explanation will be made mainly on the difference over the fifth embodiment. Thereby, it should be noted that the same reference numerals are used for the parts identical to or equivalent to the parts of the fifth embodiment and the description thereof will be simplified or omitted.

(1) Disconnect the gas supply line 222 at the front side of the valve 224 and set the reaction vessel 202 into a glove box of an argon (Ar) gas ambient.

(2) Take out the auxiliary vessel 214 and the melt holding vessel 204 from the reaction vessel (3) Load the melt 208 containing Ga forming the source and Na forming the flux into the melt holding vessel 204. In the present example, the ratio of Na or Na/(Na+Ga) in the melt 208 is set to 0.4 (Na/(Na+Ga)=0.4).

(4) Load sodium into the auxiliary vessel 214.

(5) Accommodate the melt holding vessel 204 into the auxiliary vessel 214.

(6) Dispose the melt holding vessel 204 and the auxiliary vessel 214 to the reaction vessel 202 and set to respective predetermined positions.

(7) Close the lid of the reaction vessel 202.

(8) Close the valve 224 and disconnect the reaction vessel 202 from outside.

(9) Take out the reaction vessel 202 from the glove box and connect the gas supply line 222 at the front side of the valve 224.

(10) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(11) Close the valve 224. With this, the reaction vessel 224 is in a hermetically sealed state.

(12) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(13) Hold this state for about 300 hours.

(14) After the duration of about 300 hours has passed, the energization of the heater 206 is stopped and the reaction vessel 202 is cooled.

When the reaction vessel 202 was opened after the cooling, it was observed that there occurred no substantial growth of junk crystals on the inner wall surface of the melt holding vessel 204 and it was observed also that a GaN crystal 250 is grown with a size of about 6 mm in the c-axis direction at the bottom of the melt holding vessel 204. It should be noted that the amount of sodium remaining in the melt 208 was the largest with the present invention than any of the fifth embodiment and sixth embodiment.

As explained heretofore, the precipitation of unnecessary junk crystals (microcrystals) on the inner wall surface of the melt holding vessel is suppressed effectively with the present embodiment similarly to the case of the fifth embodiment and the sixth embodiment. Thus, it is possible to use the majority of the source material for the crystal growth of the seed crystal 210. Further, because the liquid in the auxiliary vessel 214 is an alkali metal, it becomes possible to reduce the evaporation of the alkali metal held in the melt holding vessel 204, and it becomes possible to carry out the crystal growth while stabilizing the amount of the alkali metal in the melt holding vessel 204. Thus, it becomes possible to obtain a GaN crystal larger than the GaN crystal of any of the fifth embodiment and the sixth embodiment.

Eighth Embodiment

Next, an eighth embodiment of the present invention will be described.

This eight embodiment has the feature of using silicon nitride having a thermal conductivity lower than that of P-BN for the melt holding vessel 204 in the fifth embodiment explained previously. Otherwise, the present embodiment is the same as the second embodiment. Hereinafter, explanation will be made mainly on the difference over the fifth embodiment. Thereby, it should be noted that the same reference numerals are used for the parts identical to or equivalent to the parts of the fifth embodiment and the description thereof will be simplified or omitted.

(1) Disconnect the gas supply line 222 at the front side of the valve 224 and set the reaction vessel 202 into a glove box of an argon (Ar) gas ambient.

(2) Take out the auxiliary vessel 214 and the melt holding vessel 204 from the reaction vessel 202.

(3) Load the melt 208 containing Ga forming the source and Na forming the flux into the melt holding vessel 204. In the present example, the ratio of Na or Na/(Na+Ga) in the melt 208 is set to 0.4 (Na/(Na+Ga)=0.4).

(4) Load sodium into the auxiliary vessel 214.

(5) Accommodate the melt holding vessel 204 into the auxiliary vessel 214.

(6) Dispose the melt holding vessel 204 and the auxiliary vessel 214 to the reaction vessel 202 and set to respective predetermined positions.

(7) Close the lid of the reaction vessel 202.

(8) Close the valve 224 and disconnect the reaction vessel 202 from outside.

(9) Take out the reaction vessel 202 from the glove box and connect the gas supply line 222 at the front side of the valve 224.

(10) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(11) Close the valve 224. With this, the reaction vessel 224 is in a hermetically sealed state.

(12) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(13) Hold this state for about 300 hours. (14) After the duration of about 300 hours has passed, the energization of the heater 206 is stopped and the reaction vessel 202 is cooled.

When the reaction vessel 202 was opened after the cooling, it was observed that there occurred no substantial growth of junk crystals on the inner wall surface of the melt holding vessel 204 and it was observed also that a GaN crystal 250 is formed with a size of about 7 mm in the c-axis direction at the bottom of the melt holding vessel 204.

As explained heretofore, the dissipation of heat of formation at the time of nucleation to the inner wall surface of the melt holding vessel 204 is smaller with the present embodiment than in the case of the fifth through seventh embodiments because of the smaller thermal conductivity of the melt holding vessel 204, and thus, re-melting of the crystal nuclei is achieved more efficiently as compared with the case of the fifth through seventh embodiments. Thus, precipitation of junk crystals on the inner wall surface of the melt holding vessel 204 is suppressed. As a result, it becomes possible to obtain a GaN crystal larger than the GaN crystal of any of the fifth through seventh embodiments.

Ninth Embodiment

Figure 8:
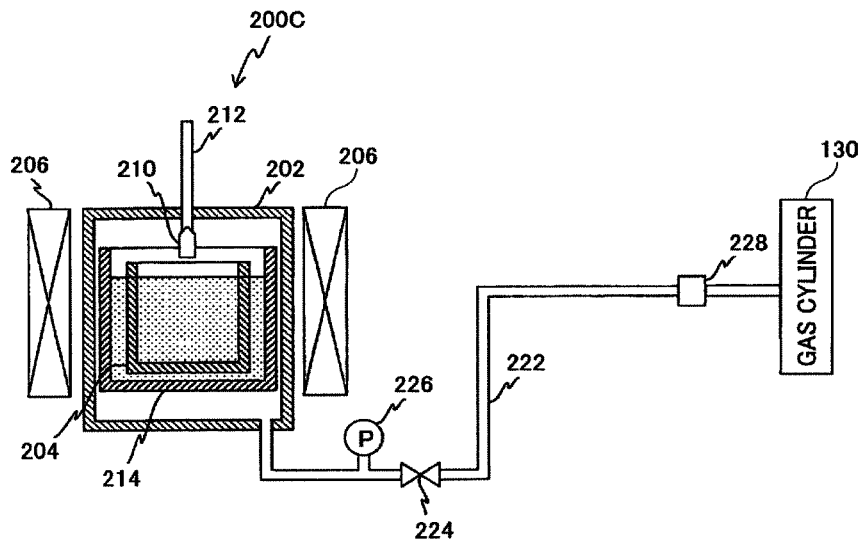
FIG. 8 is a diagram for explaining a general construction of a manufacturing apparatus for implementing a manufacturing method of a GaN crystal according to a ninth embodiment of the present invention.

Next, a ninth embodiment of the present invention will be described with reference to FIGS. 8 and 9. FIG. 8 shows a schematic construction of a manufacturing apparatus 200C of a GaN crystal as an example of the manufacturing apparatus of group III nitride crystal according to the ninth embodiment of the present invention.

This manufacturing apparatus 200C has the feature of adding a seed crystal holding mechanism 212 holding the seed crystal 210 to the manufacturing apparatus 200B of the fifth embodiment explained previously. Otherwise, the present embodiment is the same as the fifth embodiment. Hereinafter, explanation will be made mainly on the difference over the fifth embodiment. Thereby, it should be noted that the same reference numerals are used for the parts identical to or equivalent to the parts of the fifth embodiment and the description thereof will be simplified or omitted. The seed crystal holding mechanism 212 can move the seed crystal 210 up and down without opening the reaction vessel 202.

Next, the manufacturing method of a GaN crystal conducted by the manufacturing apparatus 200C of the construction noted above will be explained.

(1) Disconnect the gas supply line 222 at the front side of the valve 224 and set the reaction vessel 202 into a glove box of an argon (Ar) gas ambient.

(2) Take out the auxiliary vessel 214 and the melt holding vessel 204 from the reaction vessel 202.

(3) Load the melt 208 containing Ga forming the source and Na forming the flux into the melt holding vessel 204. In the present example, the ratio of Na or Na/(Na+Ga) in the melt 208 is set to 0.4 (Na/(Na+Ga)=0.4).

(4) Load sodium into the auxiliary vessel 214.

(5) Set the melt holding vessel 204 in the auxiliary vessel 214.

(6) Accommodate the melt holding vessel 204 together with the auxiliary vessel 214 into the reaction vessel 202 and set to respective predetermined positions.

(7) Attach a columnar GaN crystal of a length of about 5 mm in c-axis direction on the seed crystal holding mechanism 212 as a seed crystal 210.

(8) Close the lid of the reaction vessel 202.

(9) Close the valve 224 and disconnect the reaction vessel 202 from outside.

(10) Take out the reaction vessel 202 from the glove box and connect the gas supply line 222 at the front side of the valve 224.

(11) Open the valve 224 and supply the nitrogen gas into the reaction vessel 202. Here, the pressure of the nitrogen gas is set to 2.5 MPa by using the pressure regulator 228. This pressure is a pressure chosen such that the pressure inside the reaction vessel 202 becomes 5 MPa when the melt 208 has reached the crystal growth temperature. Here, a crystal growth temperature of 800° C. is used for an example.

(12) Close the valve 224. With this, the reaction vessel 224 is in a hermetically sealed state.

(13) Energize the heater 206 and raise the temperature of the melt 208 from room temperature (27° C.) to the crystal growth temperature (800° C.) in about one hour. With increase of the temperature, the pressure inside the closed reaction vessel 202 is increased and the total pressure inside the reaction vessel 202 reaches 5 MPa when the crystal growth temperature (800° C.) has been reached. Thereafter, the pressure of the pressure regulator 228 is set to 5 MPa and the valve 224 is opened.

(14) Hold this state for about 10 hours.

Figure 9:
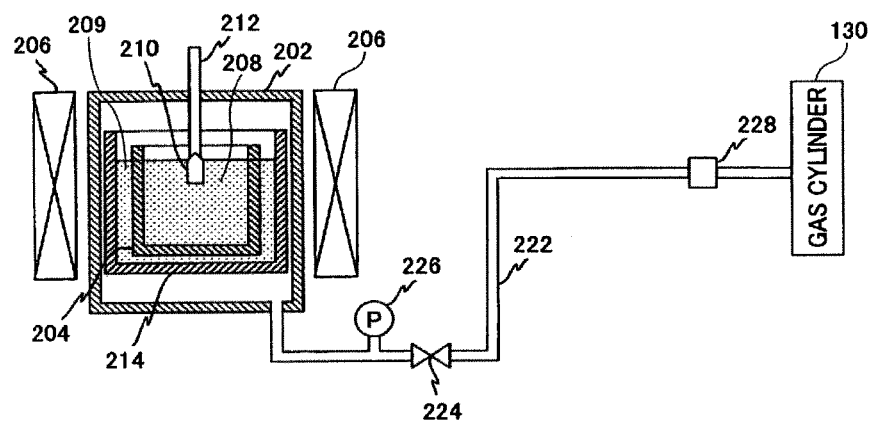
FIG. 9 is a diagram for explaining the manufacturing method with the manufacturing apparatus of FIG. 8.

(15) Lower the seed crystal 210 by operating the seed crystal holding mechanism 212 such that the seed crystal 210 is contacted with the melt 208 or dipped into the melt 108 (so-called seeding) as showing in the example of FIG. 9. With this, crystal growth of the seed crystal 210 is started.

(16) Hold this state for about 300 hours. During this interval, the temperature of the wall of the melt holding vessel 204 is equal to or higher than the temperature of the melt 208.

(17) Pull up the seed crystal 210 on which the crystal growth has been made from the melt 208 after about 300 hours by operating the seed crystal holding mechanism 212.

(18) Stop the energization of the heater 206.

When the reaction vessel 202 was opened after cooling, it was observed that there occurred no substantial growth of junk crystals on the inner wall surface of the melt holding vessel 204 and that the seed crystal 210 was grown to have a length of about 11 mm in the c-axis direction.

As will be understood from the foregoing explanation, the manufacturing apparatus 200C of the present embodiment forms a dipping mechanism by the seed crystal holder 212 and a nitrogen gas supply mechanism by the gas supply line 222, the valve 224, the pressure meter 226 and the pressure regulator 228.

As explained heretofore, the temperature of the melt holding vessel 204 is higher than that of the melt 208 and there occurs no dissipation of the heat of formation associated with nucleation. As a result, nucleation is suppressed successfully. As a result, precipitation of unnecessary microcrystals on the inner wall surface of the melt holding vessel 204 is suppressed. Thus, it is possible to use the majority of the source material for the crystal growth of the seed crystal 210. Thus, it becomes possible to grow the seed crystal to a large size and with high quality in the duration shorter than in the conventional art.

Further, while the explanation has been made heretofore for the case of using the manufacturing apparatus of GaN crystal for the manufacturing apparatus of group III nitride crystal, the present invention is not limited to this and the nitride crystal may be a nitride crystal of a group III metal other than Ga.

Further, it is also possible to use an alkali metal other than Na for the flux.

Tenth Embodiment

Figure 10:
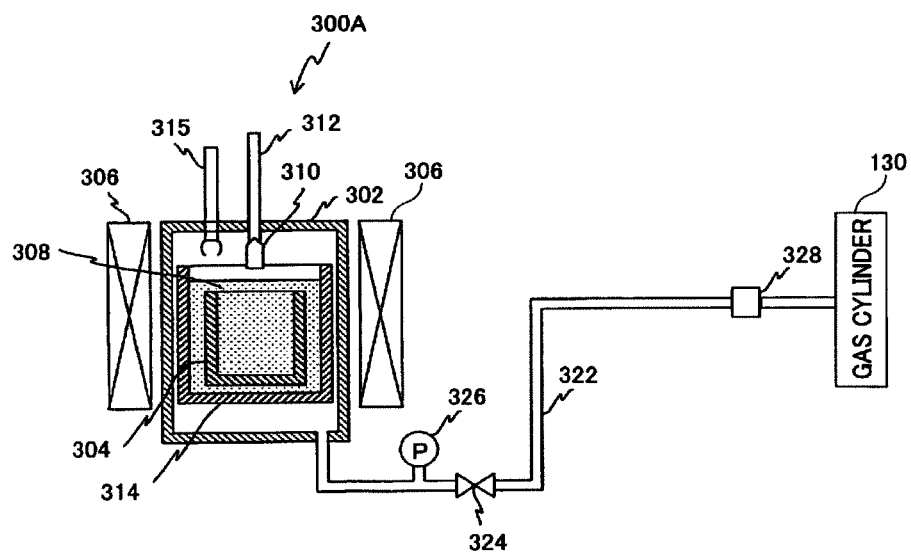
FIG. 10 is a diagram for explaining a general construction of a manufacturing apparatus for implementing a manufacturing method of a GaN crystal according to a tenth embodiment of the present invention.
Figure 12:
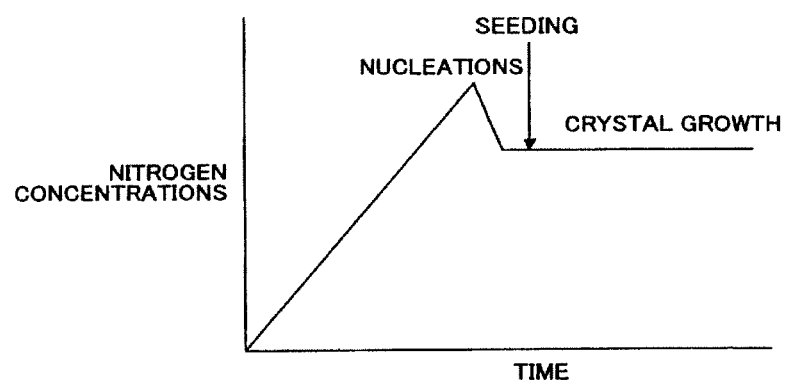
FIG. 12 is a diagram for explaining the manufacturing method with the manufacturing apparatus of FIG. 10.

Next, a tenth embodiment of the present invention will be described with reference to FIGS. 10 and 12. FIG. 10 shows a schematic construction of a manufacturing apparatus 300A of a GaN crystal as an example of the manufacturing apparatus of group III nitride crystal according to the tenth embodiment of the present invention.

The manufacturing apparatus 300A shown in FIG. 10 is constructed by a reaction vessel 302, a melt holding vessel 304 used for a holding vessel, a fixed auxiliary vessel 314, a heater 306 used for a heating unit, a seed crystal holder 312 holding a seed crystal 310, a vessel holder 315 moving the melt holding vessel 304 up and down, a gas supply line 322, a valve 324, a pressure meter 326, a pressure regulator 328, and the like.

The reaction vessel 302 is a vessel of stainless steel having a closed form. In this reaction vessel 302, the melt holding vessel 304 is accommodated.

The seed crystal holder 312 can move the seed crystal 310 up and down without opening the reaction vessel 302.

The melt holding vessel 304 is formed of P-BN (pyrolytic boron nitride) and can be taken out from the reaction vessel 302. The melt holding vessel 304 is loaded with a melt 308 containing sodium (Na) as an alkali metal and metal gallium (Ga) as a group III metal.

The fixed auxiliary vessel 314 is formed of P-BN and has a size capable of accommodating therein the melt holding vessel 304. This fixed auxiliary vessel 314 is accommodated in the reaction vessel 302.

The vessel holder 315 can move the melt holding vessel 304 up and down without opening the reaction vessel 302.

The heater 306 is provided outside of the reaction vessel 302 adjacent thereto. Thus, the melt holding vessel 304 is heated via the reaction vessel 302 and the fixed auxiliary vessel 314.

The gas supply line 322 is a conduit for supplying a nitrogen ($N_2$) gas into the reaction vessel 302 and is provided between the reaction vessel 302 and the nitrogen gas cylinder 130.

The valve 324 is provided on the gas supply line 322 in the part close to the reaction vessel 302. When the valve 324 is open, the nitrogen gas is supplied to the reaction vessel 302, while when the valve 124 is closed, the supply of the nitrogen gas to the reaction vessel 302 is shutdown. Further, the gas supply line 322 can be disconnected at a front side (the side closer to the nitrogen gas cylinder 130) of the valve 324. With this, it becomes possible to work on the reaction vessel 302 by moving the reaction vessel 102 into a glove box.

The pressure regulator 328 is provided on the gas supply line 322 in the part close to the nitrogen gas cylinder 130 and is used for regulating the pressure of the nitrogen gas supplied into the reaction vessel 302.

The pressure meter 326 is provided on the gas supply line 322 in the part between the valve 324 and the reaction vessel 302 and is used for monitoring the pressure of the nitrogen gas supplied into the reaction vessel 302.

Figure 11A:
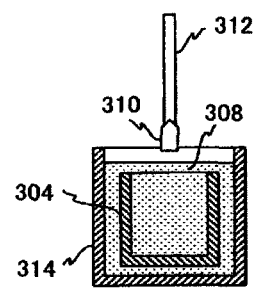
FIG. 11A is a first diagram for explaining the manufacturing method with the manufacturing apparatus of FIG. 10.
Figure 11B:
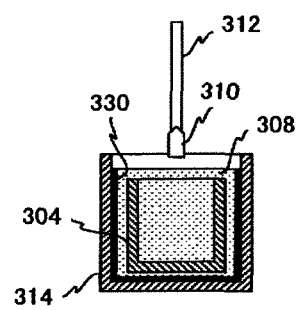
FIG. 11B is a second diagram for explaining the manufacturing method with the manufacturing apparatus of FIG. 10.

Next, the manufacturing method of a GaN crystal conducted by the manufacturing apparatus 300A of the construction noted above will be explained with reference to FIGS. 11A-11C.

(1) Disconnect the gas supply line 322 at the front side of the valve 324 and set the reaction vessel 302 into a glove box of an argon (Ar) gas ambient.

(2) Take out the fixed auxiliary vessel 314 and the melt holding vessel 304 from the reaction vessel 302 and load a melt 308 containing source Ga and flux Na into the fixed auxiliary vessel 314. In the present example, the ratio of Na or Na/(Na+Ga) in the melt 308 is set to 0.4 (Na/(Na+Ga)=0.4).

(3) Submerge the melt holding vessel 304 in the melt 308 in the fixed auxiliary vessel 314. With this, the interior of the melt holding vessel 304 is filled with the melt 308 (see FIG. 11A).

(4) Accommodate the melt holding vessel 304 together with the fixed auxiliary vessel 314 into the reaction vessel 302 and set to respective predetermined positions.

(5) Attach a columnar GaN crystal of a length of about 5 mm in c-axis direction on the seed crystal holder 312 as a seed crystal 310.

(6) Close the lid of the reaction vessel 302.

(7) Close the valve 324 and disconnect the reaction vessel 302 from outside.

(8) Take out the reaction vessel 302 from the glove box and connect the gas supply line 322 at the front side of the valve 324.

(9) Open the valve 324 and supply the nitrogen gas into the reaction vessel 302. Here, the pressure of the nitrogen gas is set to 2.5 MPa by using the pressure regulator 328. This pressure is a pressure chosen such that the pressure inside the reaction vessel 302 becomes 5 MPa when the melt 308 has reached the crystal growth temperature. Here, a crystal growth temperature of 800° C. is used for an example.

(10) Close the valve 324. With this, the reaction vessel 324 is in a hermetically sealed state.

(11) Energize the heater 306 and raise the temperature of the melt 308 from room temperature (27° C.) to the crystal growth temperature (800° C.) in about one hour. With increase of the temperature, the pressure inside the closed reaction vessel 302 is increased and the total pressure inside the reaction vessel 302 reaches 5 MPa when the crystal growth temperature (800° C.) has been reached. Thereafter, the pressure of the pressure regulator 328 is set to 5 MPa and the valve 324 is opened.

(12) Hold this state for about 50 hours. With this, there is caused increase of nitrogen concentration in the melt 308 with time as shown in FIG. 12, wherein FIG. 12 shows an example of such increase of nitrogen concentration in the melt 308 with time. When the nitrogen concentration reaches a predetermined value, there occurs nucleation and the nitrogen concentration in the melt 308 is stabilized. As an example, there are formed nuclei of junk crystals on the inner wall surface of the fixed auxiliary vessel 314 and the nitrogen concentration in the melt 308 becomes almost constant thereafter. Thus, the nitrogen concentration in the melt 308 is saturated and stabilized. Thereafter, the nuclei formed on the inner wall surface of the fixed auxiliary vessel cause growth and junk crystals 330 are formed. During this process, it should be noted that there occurs little precipitation of junk crystals on the inner wall surface of the melt holding vessel 304. Further, it should be noted that this holding duration is determined in advance by experiment as the duration needed for the nitrogen concentration in the melt 308 to reach a stabilized state.

Figure 11C:
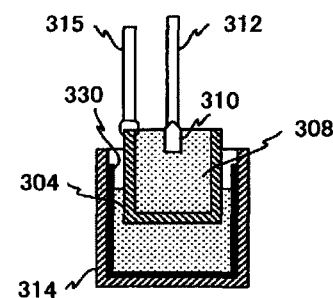
FIG. 11C is a third diagram for explaining the manufacturing method with the manufacturing apparatus of FIG. 10.

(13) Pull up the melt holding vessel 304 by using the vessel holder 315 and contact or dip the seed crystal 310 with or into the melt 308 in the melt holding vessel 304 (see FIG. 11C). With this, crystal growth of the seed crystal 310 is started.

(14) Hold the state of FIG. 11C for about 300 hours.

(15) After about 300 hours, the melt holding vessel 304 is returned to the fixed auxiliary vessel 314 by using the vessel holder 315.

(16) Stop the energization of the heater 306.

When the reaction vessel 302 was opened after cooling, it was observed that the seed crystal 310 was grown to have a length of about 10 mm in the c-axis direction similarly to the tenth embodiment noted before.

As will be understood from the foregoing explanation, the manufacturing apparatus 300A of the present embodiment forms a dipping mechanism by the vessel holder 315 and the seed Crystal holder 312 and a nitrogen gas supply mechanism by the gas supply line 322, the valve 324, the pressure meter 326 and the pressure regulator 328.

As explained heretofore, the present embodiment submerges the melt holding vessel 304 into the fixed auxiliary vessel 314 filled with the melt 308 and pulls up the melt holding vessel from the fixed auxiliary vessel 314 when the nitrogen concentration in the melt 308 is stabilized. Thereby, the seed crystal is contacted with or dipped into the melt 308 in the melt holding vessel 304. With this, growth of the junk crystals on the inner wall surface of the melt holding vessel 304 is suppressed during the interval in which the seed crystal 310 is dipped, and it becomes possible to use the majority of source material for the crystal growth of the seed crystal 310. Thus, it becomes possible to suppress the growth of junk crystals and grow the seed crystal to a large size with high quality in the duration shorter than in the conventional art.

Eleventh Embodiment

Next, a second embodiment of the present invention will be described with reference to FIG. 13.

Figure 13:
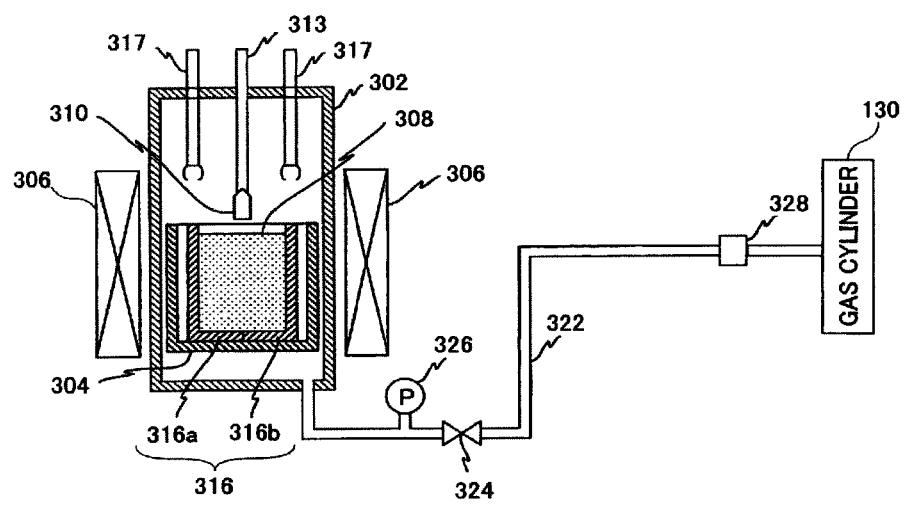
FIG. 13 is a diagram for explaining a general construction of a manufacturing apparatus for implementing a manufacturing method of a GaN crystal according to an eleventh embodiment of the present invention.

FIG. 13 shows a schematic construction of a manufacturing apparatus 300B of a GaN crystal as an example of the manufacturing apparatus of group III nitride crystal according to the eleventh embodiment of the present invention.

Hereinafter, those parts identical or equivalent to the parts of the tenth embodiment described before are designated by the same reference numerals and the description thereof will be simplified or omitted.

The manufacturing apparatus 300B shown in FIG. 13 is constructed by a reaction vessel 302, a melt holding vessel 304 (second vessel), a movable auxiliary vessel 316 (first vessel), a heater 306 used for a heating unit, a seed crystal holder 312 holding a seed crystal 310, a vessel holder 317 (driving mechanism) moving the movable auxiliary vessel 316 up and down, a gas supply line 322, a valve 324, a pressure meter 326, a pressure regulator 328, and the like.

The movable auxiliary vessel 316 is formed of P-BN and has a shape demagnifying the melt holding vessel 304. It should be noted that this movable auxiliary vessel 316 can be split into two part (316a, 316b).

The vessel holder 317 can move the movable auxiliary vessel 316 up and down without opening the reaction vessel 302.

The heater 306 is provided outside the reaction vessel 302 adjacent thereto similarly to the tenth embodiment.

Next, the manufacturing method of a GaN crystal conducted by the manufacturing apparatus 300B of the construction noted above will be explained with reference to FIGS. 14A-14C.

(1) Disconnect the gas supply line 322 at the front side of the valve 324 and set the reaction vessel 302 into a glove box of an argon (Ar) gas ambient.

(2) Take out the melt holding vessel 304 from the reaction vessel 302 and set the movable auxiliary vessel 316 inside the melt holding vessel 304.

Figure 14A:
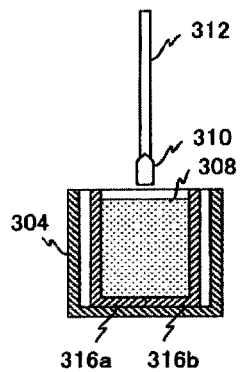
FIG. 14A is a first diagram for explaining the manufacturing method with the manufacturing apparatus of FIG. 13.
Figure 14B:
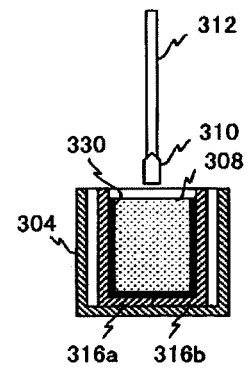
FIG. 14B is a second diagram for explaining the manufacturing method with the manufacturing apparatus of FIG. 13.

(3) Load the melt 308 containing Ga forming the source and Na forming the flux into the movable auxiliary vessel 316 (see FIG. 14A). In the present example, the ratio of Na or Na/(Na+Ga) in the melt 308 is set to 0.4 (Na/(Na+Ga)=0.4).

(4) Accommodate the movable auxiliary vessel 316 together with the melt holding vessel 304 into the reaction vessel 302 and set to respective predetermined positions.

(5) Attach a columnar GaN crystal of a length of about 5 mm in c-axis direction on the seed crystal holder 312 as a seed crystal 310.

(6) Close the lid of the reaction vessel 302.

(7) Close the valve 324 and disconnect the reaction vessel 302 from outside.

(8) Take out the reaction vessel 302 from the glove box and connect the gas supply line 322 at the front side of the valve 324.

(9) Open the valve 324 and supply the nitrogen gas into the reaction vessel 302. Here, the pressure of the nitrogen gas is set to 2.5 MPa by using the pressure regulator 328. This pressure is a pressure chosen such that the pressure inside the reaction vessel 302 becomes 5 MPa when the melt 308 has reached the crystal growth temperature. Here, a crystal growth temperature of 800° C. is used for an example.

(10) Close the valve 324. With this, the reaction vessel 324 is in a hermetically sealed state.

(11) Energize the heater 306 and raise the temperature of the melt 308 from room temperature (27° C.) to the crystal growth temperature (800° C.) in about one hour. With increase of the temperature, the pressure inside the closed reaction vessel 302 is increased and the total pressure inside the reaction vessel 302 reaches 5 MPa when the crystal growth temperature (800° C.) has been reached. Thereafter, the pressure of the pressure regulator 328 is set to 5 MPa and the valve 324 is opened.

(12) Hold this state for about 50 hours. With this, there occurs increase of nitrogen concentration in the melt 308 with time. When the nitrogen concentration has reached a predetermined value, there occurs precipitation of large number of junk crystals 330 on the inner wall surface of the movable auxiliary vessel 315 as showing in the example of FIG. 14B, and the nitrogen concentration in the melt 308 is stabilized.

Figure 14C:
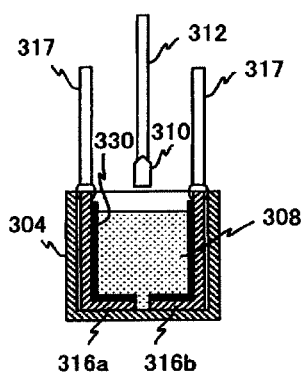
FIG. 14C is a third diagram for explaining the manufacturing method with the manufacturing apparatus of FIG. 13.

(13) Divide the movable auxiliary vessel 316 in the melt holding vessel 304 by using the vessel holder 317 (see FIG. 14C). With this, the melt 308 in the movable auxiliary vessel 308 is transferred to the interior of the melt holding vessel 304.

Figure 14D:
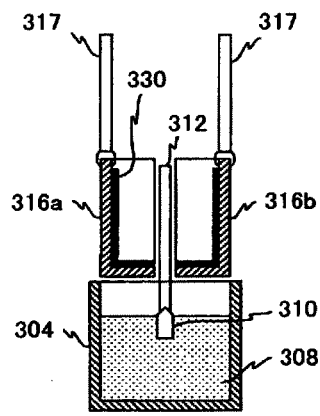
FIG. 14D is a fourth diagram for explaining the manufacturing method with the manufacturing apparatus of FIG. 13.

(14) Pull up the movable auxiliary vessel 316 in the melt holding vessel 304 by using the vessel holder 317 (see FIG. 14D).

(15) Lower the seed crystal 310 by operating the seed crystal holder 312 such that the seed crystal 310 is contacted with or dipped into the melt 308 in the melt holding vessel 308. With this, crystal growth of the seed crystal 310 is started.

(16) Hold this state for about 300 hours.

(17) Pull up the seed crystal 310 on which the crystal growth has been made from the melt 308 after about 300 hours by operating the seed crystal holder 312.

(18) Stop the energization of the heater 306.

When the reaction vessel 302 was opened after cooling, it was observed that there occurred no substantial growth of junk crystals on the inner wall surface of the melt holding vessel 304 and that the seed crystal 310 was grown to have a length of about 10 mm in the c-axis direction.

As will be understood from the foregoing explanation, the manufacturing apparatus 300B of the present embodiment forms a take out mechanism by the vessel holder 317, a dipping mechanism by the seed crystal holder 312, and a nitrogen gas supply mechanism by the gas supply line 322, the valve 324, the pressure meter 326 and the pressure regulator 328.

As explained heretofore, the present invention inserts the movable auxiliary vessel 316 filled with the melt 308 into the melt holding vessel 304 and transfers the melt 308 in the movable auxiliary vessel 316 to the melt holding vessel 304 when the nitrogen concentration in the melt 308 is stabilized. Thereafter, the movable auxiliary vessel 316 is taken out from the melt holding vessel 304. Further, the seed crystal is contacted with or dipped into the melt 308 in the melt holding vessel 304 in the state the movable auxiliary vessel 316 is taken out. With this, growth of the junk crystals on the inner wall surface of the melt holding vessel 304 is suppressed during the interval in which the seed crystal 310 is dipped or contacted with the melt 308, and it becomes possible to use the majority of source material for the crystal growth of the seed crystal 310. Thus, it becomes possible to suppress the growth of junk crystals and grow the seed crystal to a large size with high quality in the duration shorter than in the conventional art.

While the eleventh embodiment has been explained for the case of the movable auxiliary vessel 316 is split into two parts, the present invention is not limited to such a case. Thus, it is sufficient that the movable auxiliary vessel can be accommodated into the melt holding vessel 304 and is capable of being taken out therefrom. In this case, it is sufficient that there is provided a tilting mechanism for tinting the movable auxiliary vessel for causing the transfer of the melt in the movable auxiliary vessel into the melt holding vessel 304.

Twelfth Embodiment

Next, a twelfth embodiment of the present invention will be described with reference to FIG. 15.

Figure 15:
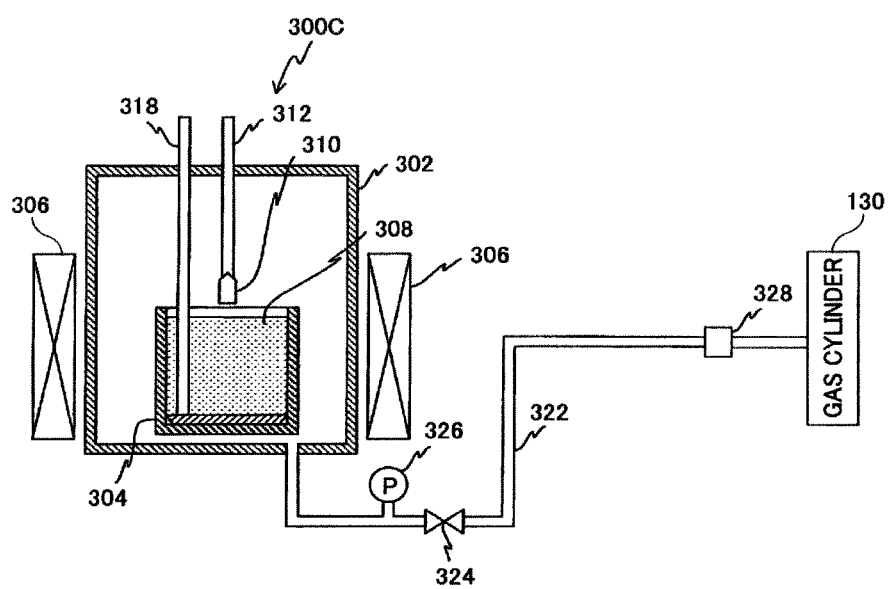
FIG. 15 is a diagram for explaining a general construction of a manufacturing apparatus for implementing a manufacturing method of a GaN crystal according to a twelfth embodiment of the present invention.

FIG. 15 shows a schematic construction of a manufacturing apparatus 300C of a GaN crystal as an example of the manufacturing apparatus of group III nitride crystal according to the twelfth embodiment of the present invention. Hereinafter, those parts identical or equivalent to the parts of the tenth embodiment described before are designated by the same reference numerals and the description thereof will be simplified or omitted.

The manufacturing apparatus 300C shown in FIG. 15 is constructed by a reaction vessel 300, a melt holding vessel 304, a blade member 318 used for a removing means, a heater 306 used for a heating unit, a seed crystal holder 312 holding a seed crystal 310, a gas supply line 322, a valve 324, a pressure meter 326, a pressure regulator 328, and the like.

The blade member 318 is formed of a blade and a blade holding rod for causing the blade to move up and down. The blade has a shape generally identical to the lower part of the melt holding vessel 304 and is formed such that an edge of the blade makes a contact with the inner wall surface of the melt holding vessel 304. The blade member 318 is movable up and down without opening the reaction vessel 302.

The heater 306 is provided outside the reaction vessel 302 adjacent thereto similarly to the tenth embodiment.

Next, the manufacturing method of a GaN crystal conducted by the manufacturing apparatus 300C of the construction noted above will be explained with reference to FIGS. 16A-16C.

(1) Disconnect the gas supply line 322 at the front side of the valve 324 and set the reaction vessel 302 into a glove box of an argon (Ar) gas ambient.

Figure 16A:
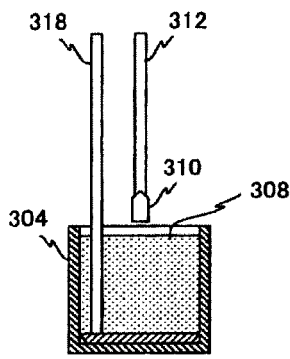
FIG. 16A is a first diagram for explaining the manufacturing method with the manufacturing apparatus of FIG. 15.
Figure 16B:
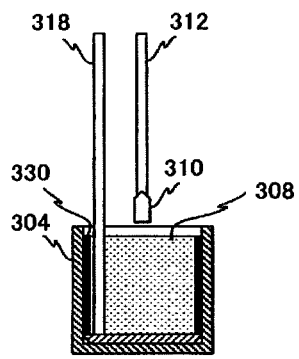
FIG. 16B is a second diagram for explaining the manufacturing method with the manufacturing apparatus of FIG. 15.
Figure 16C:
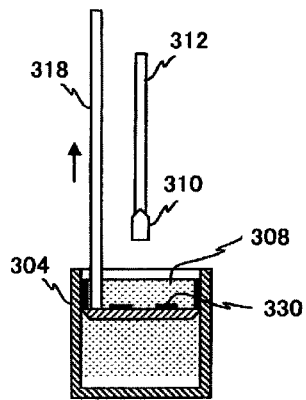
FIG. 16C is a third diagram for explaining the manufacturing method with the manufacturing apparatus of FIG. 15.

(2) Take out the melt holding vessel 304 from the reaction vessel 302 and set the blade member 318 inside the melt holding vessel 304. In the present example, the blade member 318 is disposed such that the blade makes a contact with the bottom of the melt holding vessel 304 as shown in FIG. 16A.

(3) Load the melt 308 containing Ga forming the source and Na forming the flux into the melt holding vessel 304. In the present example, the ratio of Na or Na/(Na+Ga) in the melt 308 is set to 0.4 (Na/(Na+Ga)=0.4).

(4) Accommodate the blade member 318 together with the melt holding vessel 304 into the reaction vessel 302 and set to respective predetermined positions.

(5) Attach a columnar GaN crystal of a length of about 5 mm in c-axis direction on the seed crystal holder 312 as a seed crystal 310.

(6) Close the lid of the reaction vessel 302.

(7) Close the valve 324 and disconnect the reaction vessel 302 from outside.

(8) Take out the reaction vessel 302 from the glove box and connect the gas supply line 322 at the front side of the valve 324.

(9) Open the valve 324 and supply the nitrogen gas into the reaction vessel 302. Here, the pressure of the nitrogen gas is set to 2.5 MPa by using the pressure regulator 328. This pressure is a pressure chosen such that the pressure inside the reaction vessel 302 becomes 5 MPa when the melt 308 has reached the crystal growth temperature. Here, a crystal growth temperature of 800° C. is used for an example.

(10) Close the valve 324. With this, the reaction vessel 324 is in a hermetically sealed state.

(11) Energize the heater 306 and raise the temperature of the melt 308 from room temperature (27° C.) to the crystal growth temperature (800° C.) in about one hour. With increase of the temperature, the pressure inside the closed reaction vessel 302 is increased and the total pressure inside the reaction vessel 302 reaches 5 MPa when the crystal growth temperature (800° C.) has been reached. Thereafter, the pressure of the pressure regulator 328 is set to 5 MPa and the valve 324 is opened.

(12) Hold this state for about 50 hours. With this, there occurs increase of nitrogen concentration in the melt 308 with time. When the nitrogen concentration has reached a predetermined value, there occurs precipitation of large number of junk crystals 330 on the inner wall surface of the melt holding vessel 304 as showing in the example of FIG. 16B, and the nitrogen concentration in the melt 308 is stabilized.

(13) Pull up the blade member 318. With this, the junk crystals precipitated on the inner wall surface of the melt holding vessel 304 are scraped by the blade edge (see FIG. 16C).

Figure 16D:
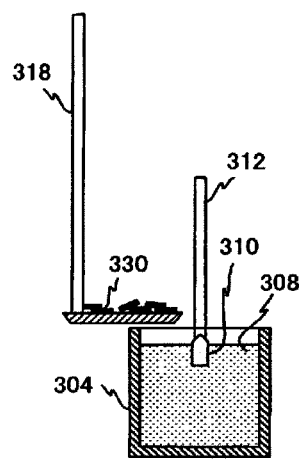
FIG. 16D is a fourth diagram for explaining the manufacturing method with the manufacturing apparatus of FIG. 15.

(14) Lower the seed crystal 310 by operating the seed crystal holder 312 such that the seed crystal 310 is contacted with the melt 308 or dipped into the melt 108 (see FIG. 16D). With this, crystal growth of the seed crystal 310 is started.

(15) Hold the state of FIG. 16D for about 300 hours.

(16) Pull up the seed crystal 310 on which the crystal growth has been made from the melt 308 after about 300 hours by operating the seed crystal holder 312.

(17) Stop the energization of the heater 306.

When the reaction vessel 302 was opened after cooling, it was observed that there occurred no substantial growth of junk crystals on the inner wall surface of the melt holding vessel 304 and that the seed crystal 310 was grown to have a length of about 10 mm in the c-axis direction.

As will be understood from the foregoing explanation, the manufacturing apparatus 300C of the present embodiment forms a dipping mechanism by the seed crystal holder 312 and a nitrogen gas supply mechanism by the gas supply line 322, the valve 324, the pressure meter 326 and the pressure regulator 328.

As explained heretofore, with the manufacturing apparatus 300C of the present embodiment, the microcrystals precipitated on the inner well surface of the melt holding vessel 304 is scraped off by the blade member and the seed crystal is contacted with or dipped into the melt 308 in the melt holding vessel 304 in the state the microcrystals are scraped off. Thus, with the present embodiment, the microcrystals precipitated on the inner wall surface of the melt holding vessel 304 are so mechanically removed, and the seed crystal is contacted to or dipped into the melt 308 in the melt holding vessel 304 in the state the microcrystals are removed mechanically. With this, growth of the junk crystals is suppressed during the interval in which the seed crystal 310 is dipped or contacted with the melt 308, and it becomes possible to use the majority of source material for the crystal growth of the seed crystal 310. Thus, it becomes possible to suppress the growth of junk crystals and grow the seed crystal to a large size with high quality in the duration shorter than in the conventional art.

While the twelfth embodiment has been explained for the case of using the blade member 318 for the removing means, it should be noted that the present invention is not limited to such a specific construction. All what is needed is to scrape of the microcrystals precipitated on the inner wall surface of the melt holding vessel 304.

Thirteenth Embodiment

Next, a thirteenth embodiment of the present invention will be described with reference to FIG. 17.

Figure 17:
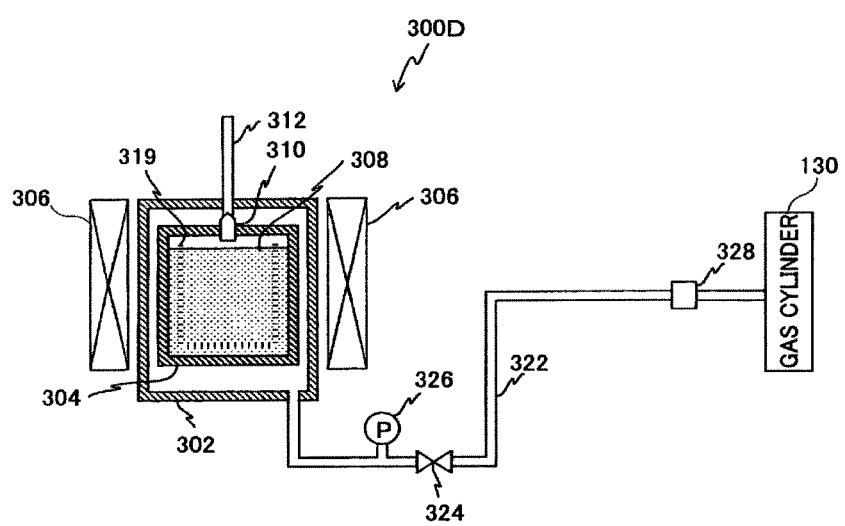
FIG. 17 is a diagram for explaining a general construction of a manufacturing apparatus for implementing a manufacturing method of a GaN crystal according to a thirteenth embodiment of the present invention.

FIG. 17 shows a schematic construction of a manufacturing apparatus 300D of a GaN crystal as an example of the manufacturing apparatus of group III nitride crystal according to the thirteenth embodiment of the present invention. Hereinafter, those parts identical or equivalent to the parts of the first embodiment described before are designated by the same reference numerals and the description thereof will be simplified or omitted.

The manufacturing apparatus 300D shown in FIG. 17 is constructed by a reaction vessel 300, mesh member 319 functioning as a growth blocking member, a heater 306 used for a heating unit, a seed crystal holder 312 holding a seed crystal 310, a gas supply line 322, a valve 324, a pressure meter 326, a pressure regulator 328, and the like.

The mesh member 319 is a basket-like member of tungsten, on which growth of junk crystals is tend to be retarded, wherein the mesh member 319 is disposed in the close proximity of the inner wall surface of the melt holding vessel 304.

The heater 306 is provided outside the reaction vessel 302 adjacent thereto similarly to the tenth embodiment.

Next, the manufacturing method of a GaN crystal conducted by the manufacturing apparatus 300D of the construction noted above will be explained with reference to FIGS. 18A-18C.

(1) Disconnect the gas supply line 322 at the front side of the valve 124 and set the reaction vessel 302 into a glove box of an argon (Ar) gas ambient.

(2) Take out the melt holding vessel 304 from the reaction vessel 302 and set the mesh member 319 inside the melt holding vessel 304.

Figure 18A:
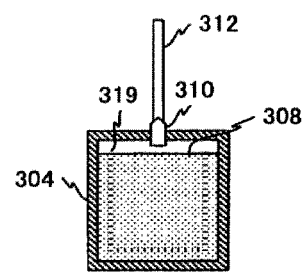
FIG. 18A is a first diagram for explaining the manufacturing method with the manufacturing apparatus of FIG. 17.
Figure 18B:
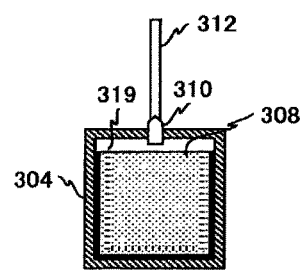
FIG. 18B is a second diagram for explaining the manufacturing method with the manufacturing apparatus of FIG. 17.

(3) Load the melt 308 containing Ga forming the source and Na forming the flux into the melt holding vessel 304 (see FIG. 18A). In the present example, the ratio of Na or Na/(Na+Ga) in the melt 308 is set to 0.4 (Na/(Na+Ga)=0.4).

(4) Dispose the mesh member 319 and the melt holding vessel 304 in the reaction vessel 302 at respective predetermined positions.

(5) Attach a columnar GaN crystal of a length of about 5 mm in c-axis direction on the seed crystal holder 312 as a seed crystal 310.

(6) Close the lid of the reaction vessel 302.

(7) Close the valve 324 and disconnect the reaction vessel 302 from outside.

(8) Take out the reaction vessel 302 from the glove box and connect the gas supply line 222 at the front side of the valve 324.

(9) Open the valve 324 and supply the nitrogen gas into the reaction vessel 302. Here, the pressure of the nitrogen gas is set to 2.5 MPa by using the pressure regulator 328. This pressure is a pressure chosen such that the pressure inside the reaction vessel 302 becomes 5 MPa when the melt 308 has reached the crystal growth temperature. Here, a crystal growth temperature of 800° C. is used for an example.

(10) Close the valve 324. With this, the reaction vessel 324 is in a hermetically sealed state.

(11) Energize the heater 306 and raise the temperature of the melt 308 from room temperature (27° C.) to the crystal growth temperature (800° C.) in about one hour. With increase of the temperature, the pressure inside the closed reaction vessel 302 is increased and the total pressure inside the reaction vessel 302 reaches 5 MPa when the crystal growth temperature (800° C.) has been reached. Thereafter, the pressure of the pressure regulator 328 is set to 5 MPa and the valve 324 is opened.

(12) Hold this state for about 50 hours. With this, there occurs increase of nitrogen concentration in the melt 308 with time. When the nitrogen concentration has reached a predetermined value, there occurs nucleation of large number of junk crystals 330 on the inner wall surface of the melt holding vessel 304 as showing in the example of FIG. 18B, and the nitrogen concentration in the melt 308 is stabilized.

Figure 18C:
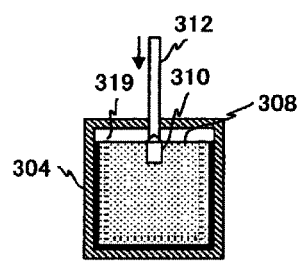
FIG. 18C is a third diagram for explaining the manufacturing method with the manufacturing apparatus of FIG. 17.

(13) Lower the seed crystal 310 by operating the seed crystal holder 312 such that the seed crystal 310 is contacted with the melt 308 or dipped into the melt 108 (see FIG. 18C). With this, crystal growth of the seed crystal 310 is started. Thereby, it should be noted that the growth of the junk crystals 330 is prevented by the mesh member 319.

(14) Hold this state for about 300 hours.

(15) Pull up the seed crystal 310 on which the crystal growth has been made from the melt 308 after about 300 hours by operating the seed crystal holder 312.

(16) Stop the energization of the heater 306.

When the reaction vessel 302 was opened after cooling, it was observed that the growth of junk crystals from the inner wall surface of the melt holding vessel 304 is blocked by the mesh member 319 and it was also observed that the seed crystal 310 was grown to have a length of about 10 mm in the c-axis direction.

As will be understood from the foregoing explanation, the manufacturing apparatus 300C of the present embodiment forms a dipping mechanism by the seed crystal holder 312 and a supply mechanism by the gas supply line 322, the valve 324, the pressure meter 326 and the pressure regulator 328.

As explained heretofore, with the manufacturing apparatus 300D of the present embodiment, the mesh member blocking the growth of junk crystals is disposed in the close proximity of the inner wall surface of the melt holding vessel 304, and thus, the crystal growth of the junk crystals precipitated on the inner wall surface of the melt holding vessel 304 is prevented by the mesh member 319. With this, it is possible to use the majority of the source material for the crystal growth of the seed crystal 310. Thus, it becomes possible to suppress the growth of junk crystals and grow the seed crystal to a large size with high quality in the duration shorter than in the conventional art.

While the eleventh embodiment has been explained for the case of using the mesh member 319 formed of tungsten, the present invention is not limited to such a particular construction. Further, the growth blocking member is not limited to the mesh member 319. All what is needed is to block the growth of the microcrystals precipitated on the inner wall surface of the melt holding vessel 304.

Fourteenth Embodiment

Figure 19:
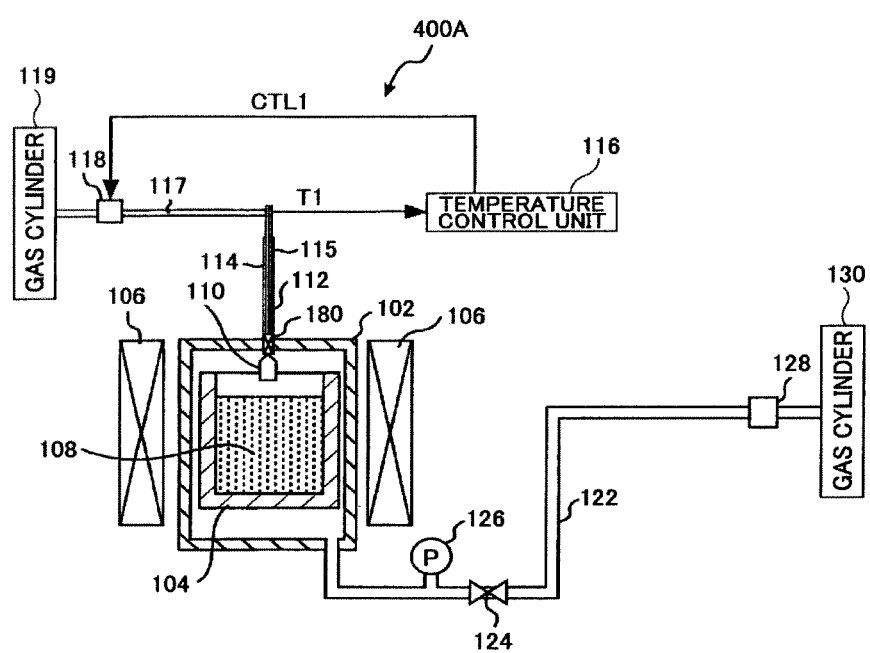
FIG. 19 is a schematic diagram showing the construction of the manufacturing apparatus according to the fourteenth embodiment.

FIG. 19 is a schematic diagram showing the construction of the manufacturing apparatus according to the fourteenth embodiment.

The manufacturing apparatus 400A according to the fourteenth embodiment has a construction similar to that of the manufacturing apparatus 100A shown in FIG. 1 except that a conduit 114, a thermocouple 115, a temperature control unit 116, a gas supply line 117, a flow meter 118 and a cylinder 119 are added to the manufacturing apparatus 100A.

It should be noted that the conduit 114 and the thermocouple 115 are inserted into the seed crystal holder 112. The gas supply line 117 has one end connected to the conduit 114 and the other end connected to the gas cylinder 119 via the flow meter 118. The flow meter 118 is mounted upon the gas supply line 117 in the vicinity of the gas cylinder 119. The gas cylinder is connected to the gas supply line 117.

The conduit 114 releases the nitrogen gas supplied from the gas supply line 117 to the interior of the seed crystal holder 112 at the foregoing end and achieves cooling of the seed crystal 110. The thermocouple 115 detects a temperature T1 of the seed crystal 110 and supplies the detected temperature T1 to the temperature control unit 116.

The gas supply line supplies the nitrogen gas supplied from the gas cylinder via the flow meter 118 to the conduit 114. The flow meter 118 adjusts, in response to a control signal CTL1 from the temperature control unit 116, the flow rate of the nitrogen gas supplied from the gas cylinder 119 and supplies the same to the gas supply line 117. The gas cylinder 119 holds the nitrogen gas.

Figure 20:
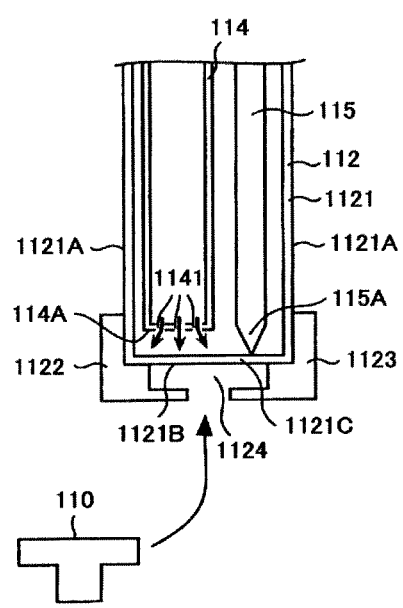
FIG. 20 is a first enlarged view diagram showing a seed crystal holder, a conduit and a thermocouple shown in FIG. 19.
Figure 21:
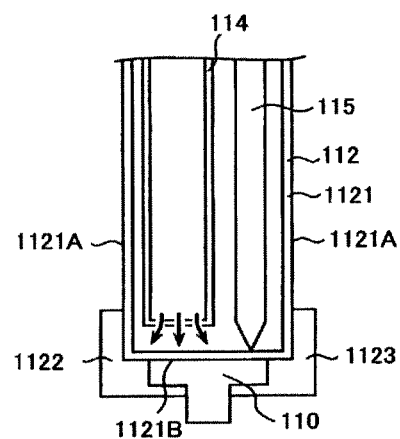
FIG. 21 is a second enlarged view diagram showing a seed crystal holder, a conduit and a thermocouple shown in FIG. 19.

FIGS. 20 and 21 are respectively the first and second enlarged view diagrams of the seed crystal holder 112, the conduit 114 and the thermocouple 115 shown in FIG. 19. Referring to FIG. 20, the seed crystal holder 112 includes a cylindrical member 1121 and fixing members 1122 and 1123. The cylindrical member 1121 has a generally circular cross-sectional shape. The fixing member 1122 has a generally L-shaped form and is fixed upon an outer peripheral surface 1121A and a bottom surface 1121B of the cylindrical member 1121 at an end 1121C of the cylindrical member 1121. Further, the fixing member 1122 has a generally L-shaped form and is fixed upon the outer peripheral surface 1121A and the bottom surface 1121B of the cylindrical member 1121 at the end 1121C of the cylindrical member 1121 in symmetry with the fixing member 1122. As a result, there is formed a space 1124 in the region surrounded by the cylindrical member 1121 and the fixing members 1122 and 1123.

The conduit 114 has a generally circular cross-sectional shape and is disposed inside the cylindrical member 1121. In this case, the bottom surface 114A of the conduit 114 is disposed so as to face the bottom surface 1121B of the cylindrical member 1121. Further, there are formed plural apertures 1141 on the bottom surface of the conduit 114. Thus, the nitrogen gas supplied to the conduit 114 hits the bottom surface 1121B of the cylindrical member 1121 via the plural apertures 1141.

The thermocouple is disposed inside the cylindrical member 1121 such that an end 115A thereof makes a contact with the bottom surface 1121B of the cylindrical member 1121.

Further, the seed crystal 110 has a shape fitting the space 1124 and is held by the seed crystal holder 112 by causing engagement with the space 1124. In this case, the seed crystal 110 makes a contact with the bottom surface 1121B of the cylindrical member 1121 (see FIG. 21).

Thus, the thermal conductivity is increase in the part between the seed crystal 110 and the cylindrical member 1121. As a result, it becomes possible to detect the temperature of the seed crystal 110 by the thermocouple 115 and it becomes also possible to cool the seed crystal 110 easily by the nitrogen gas directed to the bottom surface 1121B of the cylindrical member 1121 from the conduit 114.

Figure 22:
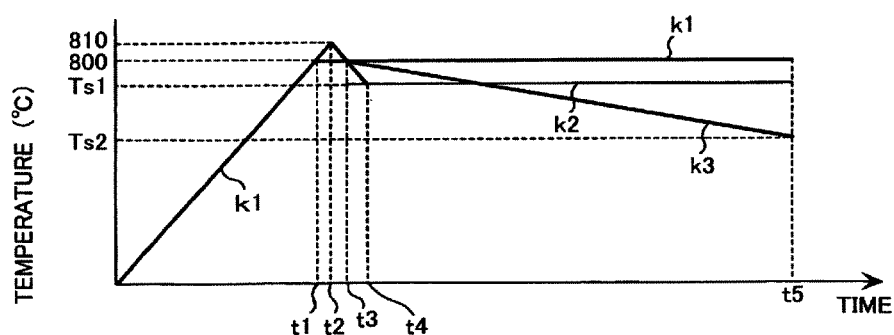
FIG. 22 is a timing chart showing a temperature of a reaction vessel and a melt holding vessel shown in FIG. 19.
Figure 23:
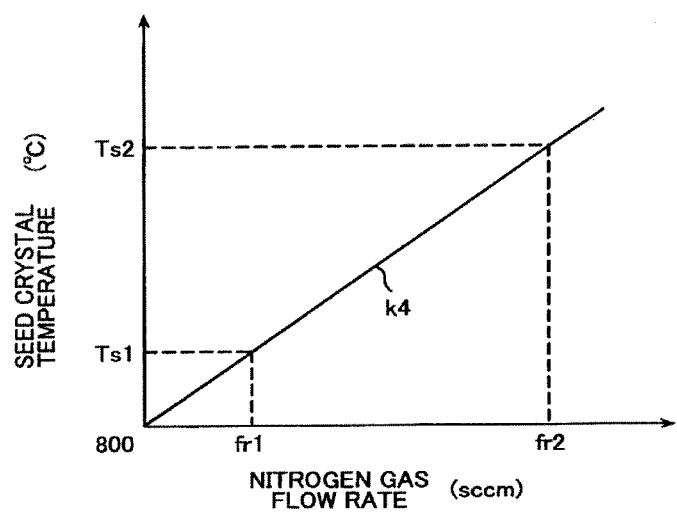
FIG. 23 is a diagram showing the relationship between a temperature of the seed crystal shown in FIG. 19 and a flow rate of a nitrogen gas.

FIG. 22 is a timing chart showing a temperature of a reaction vessel and a melt holding vessel shown in FIG. 19. Further, FIG. 23 is a diagram showing the relationship between the temperature of the seed crystal shown in FIG. 19 and the flow rate of a nitrogen gas.

In FIG. 22, it should be noted that a line k1 represents a temperature of the reaction vessel 102 and the melt holding vessel 104 while a curve k2 and a line k3 represents the temperature of the seed crystal 110.

Referring to FIG. 22, the heater 106 increases the temperature thereof along the line k1 and heats the reaction vessel 102 and the melt holding vessel 104 such that the temperatures thereof are maintained at 800° C. When the heater 106 starts heating the reaction vessel 102 and the melt holding vessel 104, the temperatures of the reaction vessel 102 and the melt holding vessel 104 start to rise and reach the temperature of 800° C. at the timing t1.

With this, Ga and Na held in the melt holding vessel 104 undergo melting and the melt 108 is formed.

Further, the seed crystal 110 is heated by the heater 180 after the timing t1, and the temperature of the seed crystal 110 reaches 810° C. at the timing t2. After the timing t2, the heater 180 is deenergized and the temperature of the seed crystal 110 lowers to 800° C. at the timing t3.

Thereby, the nitrogen gas entered into the melt holding vessel 104 from the space in the reaction vessel 102 is incorporated into the melt 108 by way of mediation of the metal Na while the temperatures of the reaction vessel 102 and the melt holding vessel 104 are elevated. Because the nitrogen concentration or the concentration of GaxNy (x, y are real numbers) in the melt 108 takes the highest value in the vicinity of the vapor-liquid interface between the space in the liquid holding vessel 104 and the melt 108, the growth of GaN crystal starts from the seed crystal 110 that is in contact with the vapor-liquid interface. In this invention, GaxNy will be designated as "group III nitride" and the concentration of GaxNy will be designated as "concentration of group III nitride".

In the case the nitrogen gas is not supplied to the conduit 114, the temperature T1 of the seed crystal 110 is identical with the temperature of the melt 108, while in the fourteenth embodiment, the seed crystal 110 is cooled by supplying the nitrogen gas to the conduit 114 and the temperature T1 of the seed crystal 110 is set lower than the temperature of the melt 108. With this, the degree of supersaturation of nitrogen and/or the group III nitride in the melt is increased in the vicinity of the seed crystal 110.

More specifically, the temperature T1 of the seed crystal 110 is set to a temperature Ts1 lower than 800° C. along the curve k2 after the timing t3. This temperature Ts1 may be 790° C., for example. Next, the method of setting the temperature T1 of the seed crystal 110 to the temperature Ts1 will be explained.

Because the temperature of the heater 106 is offset from the temperatures of the reaction vessel 102 and the melt holding vessel 104 by a predetermined temperature difference, the temperature of the heater 106 becomes $800+\alpha°$ C. when the temperatures of the reaction vessel 102 and the melt holding vessel 104 are set to $800\alpha C$. Thus, when the temperature indicated by the temperature sensor (not shown) provided in the vicinity of the heater 106 has reached $800+\alpha°$ C., the temperature control unit 116 produces the control signal CTL1, which causes to flow the nitrogen gas with a flow rate determined for setting the temperature T1 of the seed crystal 110 to the temperature Ts1, and provides the control signal CTL1 to the flow meter 118.

Thereby, the flow meter 118 causes to flow the nitrogen gas of the gas cylinder 119 to the conduit 114 via the gas supply line 117 in response to the control signal CTL1 with the flow rate determined such that the temperature T1 is set to the temperature Ts1. Thus, the temperature T1 of the seed crystal 110 goes down with the flow rate of the nitrogen gas and when the flow rate of the nitrogen gas has reached a value fr1 (sccm), the temperature T1 of the seed crystal 110 is set to the temperature Ts1 (see FIG. 23).

Thus, the flow meter 118 causes the nitrogen gas to the conduit 114 with the flow rate rf1. Further, the nitrogen gas thus supplied to the conduit 114 hits the bottom surface 1121B of the cylindrical member 1121 via the plural apertures 1141.

With this, the seed crystal 110 is cooled via the bottom surface 1121B of the cylindrical member 1121B, and the temperature T1 of the seed crystal 110 is lowered to the temperature Ts1 at the timing t4. Thereafter, the temperate T1 is held at the temperature Ts1 until the timing t5 is reached.

Because the temperature of the heater 106 has the predetermined temperate difference with regard to the temperature of the melt 108, the temperature control unit 116 controls the heater 106, when the temperature T1 of the seed crystal 110 starts to go down from 600° C., such that the temperature of the heater 106 as reported by the temperature sensor becomes the temperature that sets the temperature of the melt 108 at 800° C.

With the fourteenth embodiment, the temperature T1 of the seed crystal 110 is controlled preferably to go down along the line k3 after the timing t3. Thus, the temperature T1 of the seed crystal 110 is lowered from 800° C. to a temperature Ts2 (<Ts1) from 800° C. in the interval from the timing t1 to the timing t5. In this case, the flow meter 118 controls the flow rate of the nitrogen gas caused to flow through the conduit 114 from 0 to the flow rate fr2 along the line k4 based on the control signal CTL1 from the temperature control unit 116. When the flow rate of the nitrogen gas has reached the flow rate fr2, the temperature T1 of the seed crystal 110 is set to the temperature Ts2, which is lower than the temperature Ts1. This temperature Ts2 may be 750° C. in one example.

There are two reasons below to increase the difference between the temperature of the melt 108 (=800° C.) and the temperature T1 of the seed crystal 110 gradually.

The first reason is that, because there occurs deposition of GaN crystal on the seed crystal 110 with progress of crystal growth, it becomes difficult to set the temperature of the GaN crystal grown from the seed crystal 110 to the temperature lower than the temperature of the melt 108, unless the temperature of the seed crystal 110 is decreased gradually.

The second reason is that, with the progress of the crystal growth of the GaN crystal, there occurs consumption of Ga in the melt 108, while this leads to increase of the parameter $\gamma=Na/(Na+Ga)$, and the nitrogen concentration or the concentration of the group III nitride in the melt 108 becomes smaller than that of the supersaturation state. Alternatively, the degree of supersaturation with regard to the nitrogen concentration or the concentration of the group III nitride becomes too small. Thus, unless the temperature of the seed crystal 110 is lowered gradually, it becomes difficult to maintain the nitrogen concentration or the concentration of the group III nitride in the melt 108 to the degree of supersaturation suitable for the crystal growth of the GaN crystal.

Thus, by decreasing the temperature of the seed crystal 110 gradually with progress of crystal growth of the GaN crystal, it becomes possible to at least maintain the degree of supersaturation for nitrogen or the group III nitride in the melt 108 in the vicinity of the seed crystal 110, and it becomes possible to continue the crystal growth of the GaN crystal. As a result, it becomes possible to increase the size of the GaN crystal.

Next, the manufacturing method of a GaN crystal conducted by the manufacturing apparatus 400A shown in FIG. 19 will be explained.

(1) Disconnect the gas supply line 122 at the front side of the valve 124 and set the reaction vessel 102 into a glove box of an argon (Ar) gas ambient.

(2) Take out the melt holding vessel 104 from the reaction vessel 102 and load a melt 108 containing source Ga and flux Na into the melt holding vessel 104. In the present example, the ratio of Na or Na/(Na+Ga) in the melt 108 is set to 0.4 (Na/(Na+Ga)=0.4).

(3) Accommodate the melt holding vessel 104 into the reaction vessel 102 and set to a predetermined position.

(4) Attach a columnar GaN crystal of a length of about 5 mm in c-axis direction on the seed crystal holder 112 as a seed crystal 110.

(5) Close the lid of the reaction vessel 102.

(6) Close the valve 124 and disconnect the reaction vessel 102 from outside.

(7) Take out the reaction vessel 102 from the glove box and connect the gas supply line 122 at the front side of the valve 124.

(8) Open the valve 124 and supply the nitrogen gas into the reaction vessel 102. Here, the pressure of the nitrogen gas is set to 2.5 MPa by using the pressure regulator 128. This pressure is a pressure chosen such that the pressure inside the reaction vessel 102 becomes 5 MPa when the melt 108 has reached the crystal growth temperature. Here, a crystal growth temperature of 800° C. is used.

(9) Close the valve 124. With this, the reaction vessel 124 is in a hermetically sealed state.

(10) Energize the heater 106 and raise the temperature of the melt 108 from room temperature (27° C.) to the crystal growth temperature (800° C.) in about one hour. With increase of the temperature, the pressure inside the closed reaction vessel 102 is increased and the total pressure inside the reaction vessel 102 reaches 5 MPa when the crystal growth temperature (800° C.) has been reached. Thereafter, the pressure of the pressure regulator 128 is set to 5 MPa and the valve 124 is opened.

(11) Energize the heater 180 and heat the seed crystal 110 to a temperature of 810° C., which exceeds the temperature of the seed crystal 110.

(12) Lower the seed crystal 110 by operating the seed crystal holder 112 such that the seed crystal 110 is contacted with the melt 108 or dipped into the melt 108.

(13) Hold this state for about 20 hours. Because the temperature of the seed crystal 110 is higher than the temperature of the melt 108, the environment of the seed crystal 110 is offset from the crystal growth condition, and thus, there occurs little crystal growth in this state. Thus, there is caused increase of nitrogen concentration in the melt 108 with time as shown in FIG. 2, wherein FIG. 2 shows an example of such increase of nitrogen concentration in the melt 108 with time. After about 20 hours, the nitrogen concentration in the melt 108 reaches the concentration suitable for crystal growth. Here, it should be noted that this holding duration is determined in advance by experiment as the duration needed for the nitrogen concentration in the melt 108 to reach the concentration suitable for crystal growth.

(14) Thereafter, energization of the heater 180 is stopped and the nitrogen gas is supplied to the conduit 114 from the gas cylinder 119 via the flow meter 118 and the gas supply line 117 with the predetermined flow rate (fr1) and the temperature of the seed crystal 110 is set to the temperature Ts1, which is lower than 800° C. Now, when the temperature of the seed crystal 110 is set to the temperature Ts1 lower than the temperature of the melt 108, there occurs increase in the degree of supersaturation in the vicinity of the seed crystal 110 and the environment of the seed crystal 110 reaches a condition suitable for the crystal growth. Thereby, there is started the crystal growth of the GaN crystal from the seed crystal 110.

(15) Hold this state for about 300 hours.

(16) Pull up the seed crystal 110 on which the crystal growth has been made from the melt 108 after about 300 hours by operating the seed crystal holder 112.

(17) Stop the energization of the heater 106.

A GaN of large size is manufactured with the manufacturing method noted above.

Figure 24:
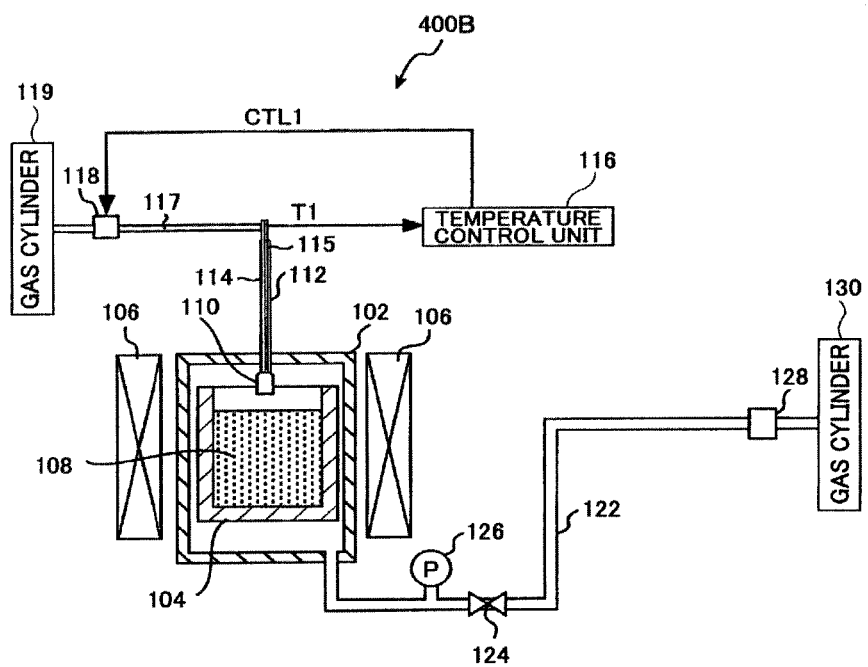
FIG. 24 is another schematic diagram showing the construction of the manufacturing apparatus according to the fourteenth embodiment.

FIG. 24 is another schematic diagram showing the construction of the manufacturing apparatus according to the fourteenth embodiment. Further, FIGS. 25 through 30 are further schematic diagrams showing the construction of the manufacturing apparatus according to the fourteenth embodiment.

The manufacturing apparatus according to the fourteenth embodiment may be any of the manufacturing apparatuses 400B, 400C, 400D, 400E, 400F, 400G and 400H respectively shown in FIGS. 24 through 30.

The manufacturing apparatus 400B shown in FIG. 24 has a construction similar to that of the manufacturing apparatus 100B shown in FIG. 3 except that the conduit 114, the thermocouple 115, the temperature control unit 116, the gas supply line 117, the flow meter 118 and the cylinder 119 are added to the manufacturing apparatus 100B.

Figure 25:
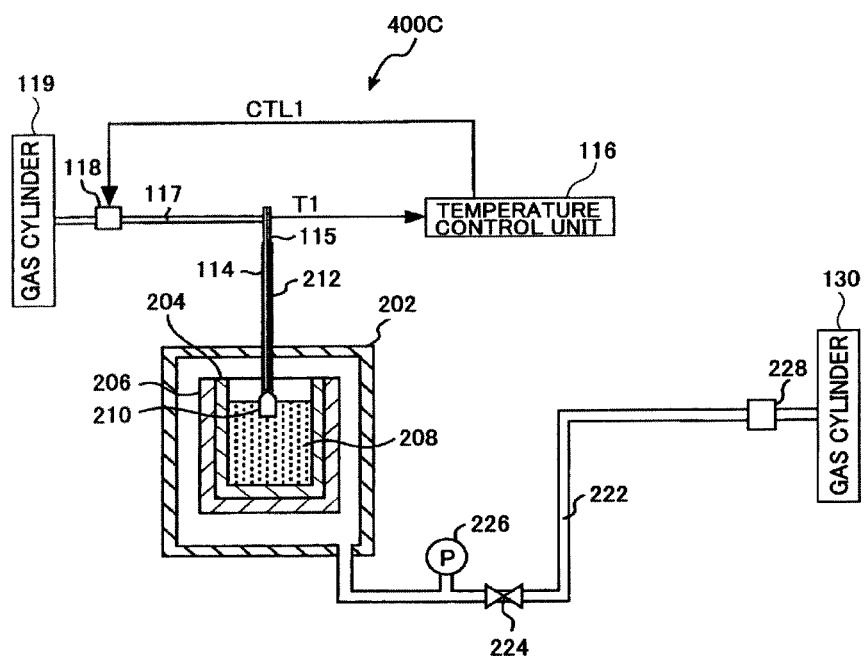
FIG. 25 is a further schematic diagram showing the construction of the manufacturing apparatus according to the fourteenth embodiment.

The manufacturing apparatus 400C shown in FIG. 25 has a construction similar to that of the manufacturing apparatus 200A shown in FIG. 5 except that the conduit 114, the thermocouple 115, the temperature control unit 116, the gas supply line 117, the flow meter 118 and the cylinder 119 are added to the manufacturing apparatus 200A.

Figure 26:
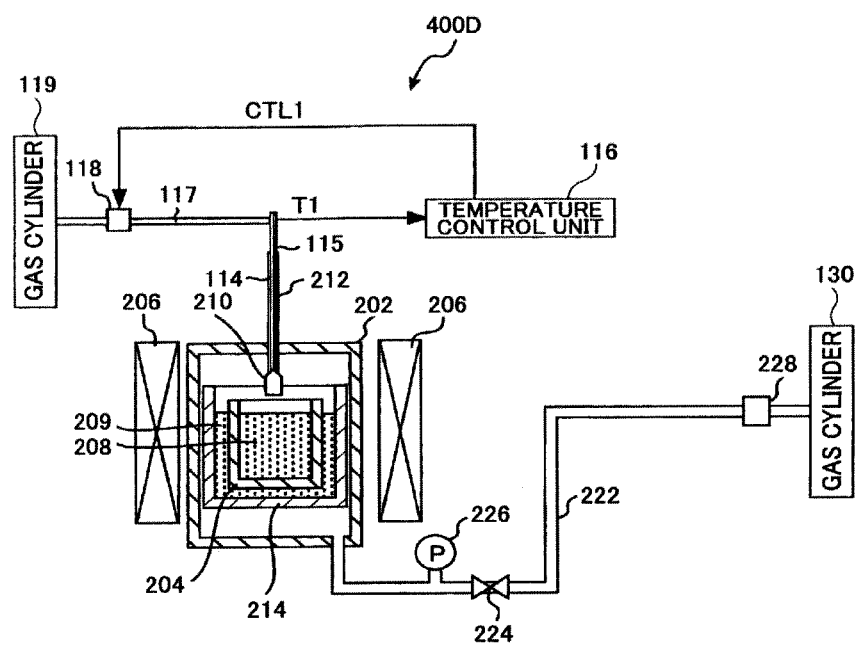
FIG. 26 is a further schematic diagram showing the construction of the manufacturing apparatus according to the fourteenth embodiment.

The manufacturing apparatus 400D shown in FIG. 26 has a construction similar to that of the manufacturing apparatus 200C shown in FIG. 8 except that the conduit 114, the thermocouple 115, the temperature control unit 116, the gas supply line 117, the flow meter 118 and the cylinder 119 are added to the manufacturing apparatus 200C.

Figure 27:
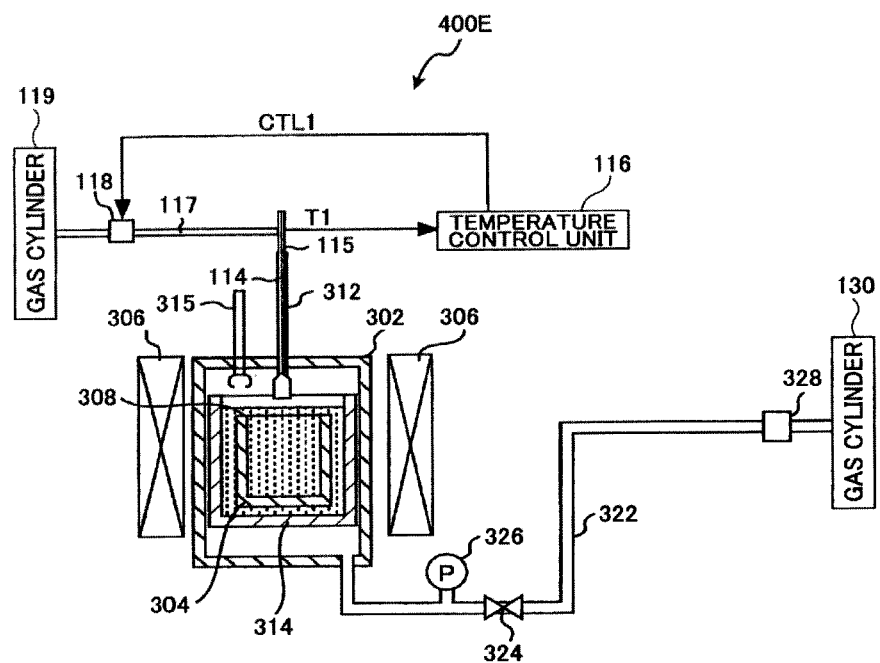
FIG. 27 is a further schematic diagram showing the construction of the manufacturing apparatus according to the fourteenth embodiment.

The manufacturing apparatus 400E shown in FIG. 27 has a construction similar to that of the manufacturing apparatus 300A shown in FIG. 10 except that the conduit 114, the thermocouple 115, the temperature control unit 116, the gas supply line 117, the flow meter 118 and the cylinder 119 are added to the manufacturing apparatus 300A.

Figure 28:
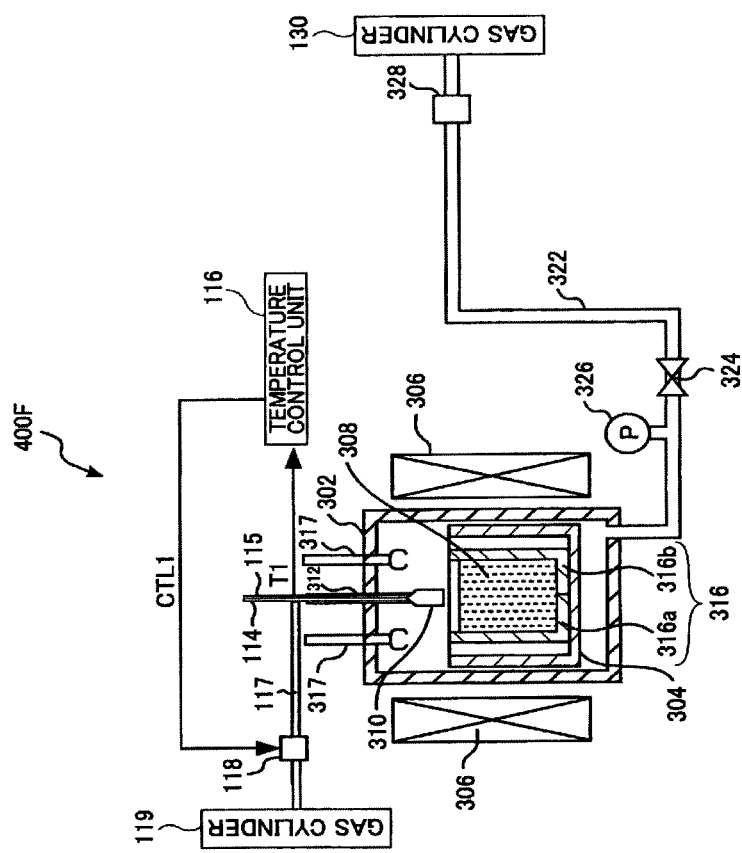
FIG. 28 is a further schematic diagram showing the construction of the manufacturing apparatus according to the fourteenth embodiment.

The manufacturing apparatus 400F shown in FIG. 28 has a construction similar to that of the manufacturing apparatus 300E shown in FIG. 13 except that the conduit 114, the thermocouple 115, the temperature control unit 116, the gas supply line 117, the flow meter 118 and the cylinder 119 are added to the manufacturing apparatus 300B.

Figure 29:
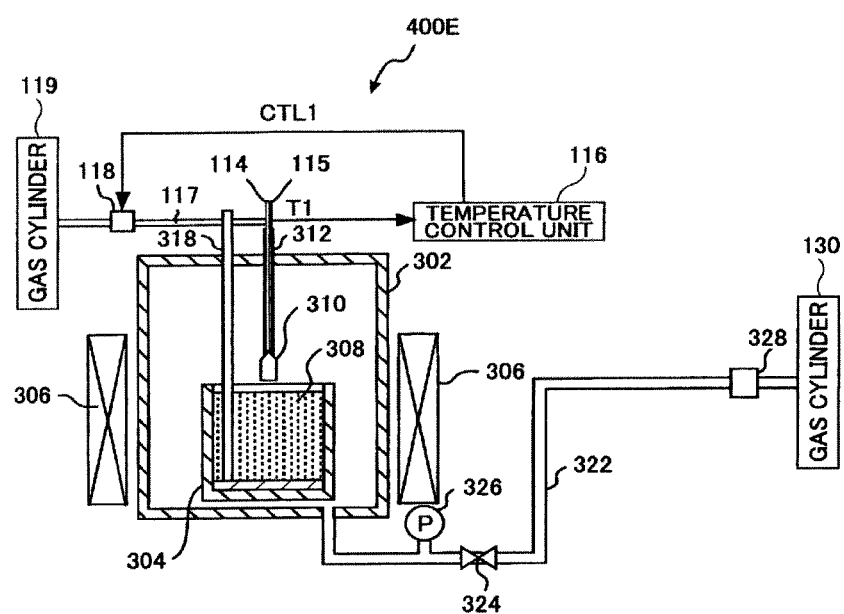
FIG. 29 is a further schematic diagram showing the construction of the manufacturing apparatus according to the fourteenth embodiment.

The manufacturing apparatus 400G shown in FIG. 29 has a construction similar to that of the manufacturing apparatus 300C shown in FIG. 15 except that the conduit 114, the thermocouple 115, the temperature control unit 116, the gas supply line 117, the flow meter 118 and the cylinder 119 are added to the manufacturing apparatus 300C.

Figure 30:
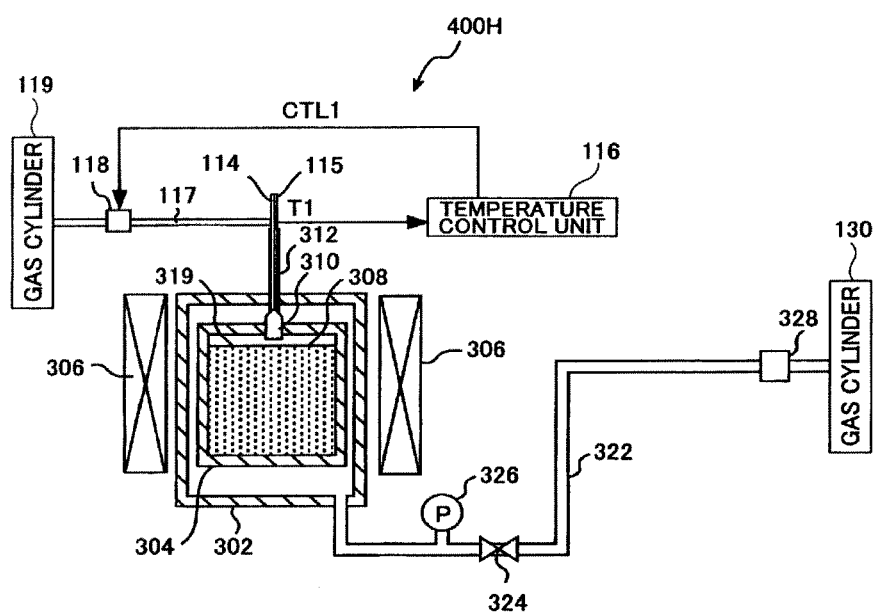
FIG. 30 is a further schematic diagram showing the construction of the manufacturing apparatus according to the fourteenth embodiment.

The manufacturing apparatus 400H shown in FIG. 30 has a construction similar to that of the manufacturing apparatus 300D shown in FIG. 17 except that the conduit 114, the thermocouple 115, the temperature control unit 116, the gas supply line 117, the flow meter 118 and the cylinder 119 are added to the manufacturing apparatus 300D.

In any of the manufacturing apparatuses 400B, 400C, 400D, 400E, 400F, 400G and 400H, the conduit 114, the thermocouple 115, each of the temperature control unit 116, the gas supply line 117, the flow meter 118 and the gas cylinder 119 functions the same function explained with reference to the manufacturing apparatus 400A.

With this, it becomes possible to manufacture the GaN crystal from the seed crystal 110 by setting the temperature thereof to be lower than the temperature of the melt 108, 208 or 308 in any of the manufacturing apparatuses 400B, 400C, 400D, 400E, 400F, 400G and 400H.

Fifteenth Embodiment

Figure 31:
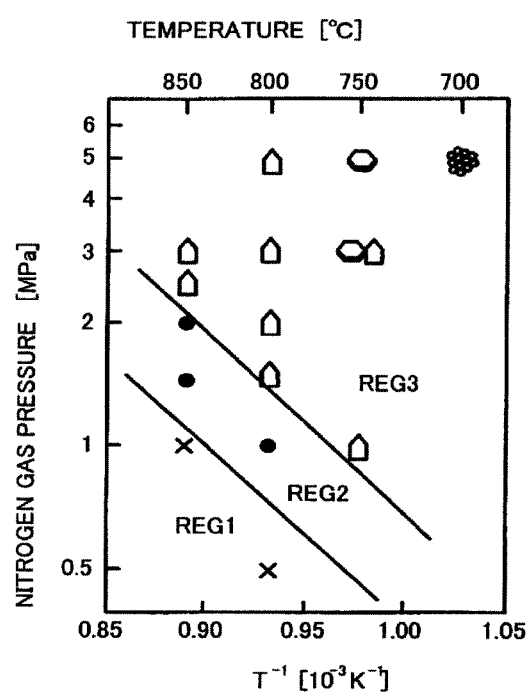
FIG. 31 is a diagram showing the relationship between the nitrogen gas pressure and the crystal growth temperature for the case of growing a GaN crystal.

FIG. 31 is a diagram showing the relationship between the nitrogen gas pressure and the crystal growth temperature for the case of growing a GaN crystal. In FIG. 31, the horizontal axis represents the crystal growth temperature (and also reciprocal of absolute temperature) while the vertical axis represents the nitrogen gas pressure.

Referring to FIG. 31, a region REG1 is the region where dissolving of GaN crystal takes place, while a region REG2 is the region where there occurs growth of GaN crystal from the seed crystal 110 while suppressing the nucleation at the interface between the holding vessel holding the melt containing Ga, Na and nitrogen and the melt. Further, a region REG3 is the region where there occurs spontaneous nucleation at the interface between the holding vessel holding the melt containing Ga, Na and nitrogen and the melt.

With the first through fourteenth embodiments described above, crystal growth of GaN crystal is achieved from the seed crystal 110 by setting the temperature of the seed crystal 110 to the temperature not suitable for the growth of the GaN crystal and further setting, thereafter, the temperature of the seed crystal 110 to the temperature suitable for crystal growth of the GaN crystal.

Thus, in FIG. 31, the temperature of the seed crystal 110 is set to the temperature included in the region REG1 (=temperature higher than temperature of melt 108) while holding the nitrogen gas pressure in the melt holding vessel 104 constant, and thereafter, the crystal growth of the GaN crystal is achieved from the seed crystal 110 by setting the temperature of the seed crystal 110 to the temperature included in the region REG2 (=temperature lower than temperature of melt 108).

According to this fifteenth embodiment, nitrogen pressure is set to the pressure included in the region REG1 for the space exposed to the melt 108 while holding the temperatures of the melt holding vessel 104 and the melt 108 constant, and crystal growth is achieved thereafter from the seed crystal by setting the nitrogen gas pressure to the pressure included in the region REG2 for the space exposed to the melt 108.

Thus, according to the fifteenth embodiment, crystal growth of the GaN crystal takes place from the seed crystal 110 by first setting the nitrogen gas pressure of the space exposed to the melt 108 to a pressure not suitable for the growth of the GaN crystal and then by setting the nitrogen gas pressure of the space exposed to the melt 108 to the pressure suitable for the growth of the GaN crystal.

According to the fifteenth embodiment, the GaN crystal is grown from the seed crystal 110 by using the manufacturing apparatus 100A shown in FIG. 1, for example. In this case, the pressure regulator 128 is used to set the nitrogen gas pressure of the space exposed to the melt 108 to the pressure not suitable for the crystal growth of the GaN crystal and the pressure suitable for the crystal growth of the GaN crystal.

Thus, crystal growth of the GaN crystal is possible also from the seed crystal 110 by first setting the nitrogen gas pressure of the space exposed to the melt 108 to a pressure not suitable for the growth of the GaN crystal and then setting the nitrogen gas pressure of the space exposed to the melt 108 to the pressure suitable for the growth of the GaN crystal.

In the fifteenth embodiment, it is also possible to grow the GaN crystal from the seed crystal 110 by setting the nitrogen gas pressure of the space exposed to the melt 208 or 308 to the pressure not suitable for the crystal growth of the GaN crystal and further setting to the pressure suitable to the crystal growth of the GaN crystal in any of the manufacturing apparatuses 100B, 200A, 200B, 200C, 300A, 300B, 300C, 300D, 400A, 400B, 400C, 400D, 400E, 400F, 400G and 400H.

Further, the present invention generally includes any technology that sets the environment (temperature and/or pressure) of the seed crystal 110 to the region REG1 (=environment not suitable for crystal growth of GaN crystal) and thereafter sets the environment of the seed crystal 108 to the region REG2 (=environment suitable for crystal growth of the GaN crystal).

Thus, in the case of growing the GaN crystal from the seed crystal by setting the environment of the seed crystal 110 to the environment not suitable for the crystal growth of the GaN crystal and thereafter setting the environment of the seed crystal 108 to the environment suitable for the crystal growth of the GaN crystal, it should be noted that the temperature of the seed crystal 110 in the region REGY2 is not limited to the temperature equal to or lower than the temperature of the melt 108, 208 or 308 but may be higher than the temperature of the melt 108, 208 or 308. For example, in the case the temperature of the melt 108, 208 or 308 is 800° C., it is possible to cause crystal growth of the GaN crystal from the seed crystal 110 in the region REG2 even in the case of setting the temperature of the seed crystal 110 to 820° C.

Further, with the present invention, the environment of the seed crystal 110 is set to the environment not suitable for the growth of the GaN crystal by shifting the nitrogen concentration in the melt 108, 208 or 308 to the region of lower concentration than the nitrogen concentration at the boundary between the region REG1 and REG2 shown in FIG. 31 and then to the environment suitable for the growth of the GaN crystal by shifting the nitrogen concentration in the melt 108, 208 or 308 to the region of higher concentration than the boundary between the region REG1 and the region REG2.

Further, while the explanation has been made heretofore for the case of using the manufacturing apparatus of GaN crystal for the manufacturing apparatus of group III nitride crystal, the present invention is not limited to this and the nitride crystal may be a nitride crystal of a group III metal other than Ga.

While the present invention has been explained for preferred embodiments, the present invention is not limited to such specific embodiments and various variations and modifications may be made within the scope of the invention described in patent claims.

Further, it is also possible to use an alkali metal other than Na for the flux.

While the present invention has been explained for preferred embodiments, the present invention is not limited to such specific embodiments and various variations and modifications may be made within the scope of the invention described in patent claims.

The present invention is based on Japanese priority patent applications 2005-070833 filed on Mar. 14, 2005, 2005-70859 also filed on Mar. 14, 2005, 2005-70889 also filed on Mar. 14, 2005, and 2006-66574 filed on Mar. 10, 2006, the entire contents thereof being incorporated herein as reference.

INDUSTRIAL APPLICATION

According to the manufacturing method of group III nitride crystal of the present invention, it becomes possible to grow a large group III nitride crystal of high quality with shorter duration as compared with the conventional art by suppressing the growth of low-quality crystals when conducting growth of a seed crystal in the state the seed crystal is held in a melt.

Further, according to the manufacturing method of the present invention, it becomes possible to grow a crystal of group III nitride of large size with shorter duration as compared with the conventional art, and it becomes possible to grow a large group III nitride crystal with shorter duration as compared with the conventional art.

Further according to the present invention, it becomes possible to grow the seed crystal to a large site with high quality in the duration shorter than in the conventional art.

The invention claimed is:

1. A method for manufacturing a group III nitride crystal in a holding vessel holding a melt containing a group III metal, an alkali meta and nitrogen, comprising the steps of:
   raising a temperature of said melt from room temperature to a crystal growth temperature:
   dissolving nitrogen into said melt at the crystal growth temperature and a crystal growth pressure:
   increasing a nitrogen concentration to a concentration level at which nucleation takes place to produce junk crystals:
   contacting a seed crystal with said melt when a nitrogen concentration in said melt is stabilized as a result of the nucleation; and
   growing the group III nitride crystal onto said seed crystal.

2. The method for manufacturing a group III nitride crystal as claimed in claim 1, further comprising the step of removing microcrystals grown from a nucleus from said melt before causing said seed crystal to contact with said melt.

3. The method for manufacturing a group III nitride crystal as claimed in claim 1, wherein said removing step comprises the steps of:
   submerging said holding vessel in a fixed auxiliary vessel filled with said melt; and
   pulling up said holding vessel for said fixed auxiliary vessel when said nitrogen concentration in said melt is stabilized, wherein said step of causing said seed crystal to make contact with said melt is conducted such that said seed crystal is contacted to said melt in said pulled up holding vessel.

4. The method for manufacturing a group III nitride crystal as claimed in claim 2, wherein said step of removing comprises the step of:
   inserting a movable auxiliary vessel filled with said melt into said holding vessel; and taking out said movable auxiliary vessel from said holding vessel after transferring said melt in said movable auxillary vessel to said holding vessel when said nitrogen concentration in said melt is stabilized.

5. The method for manufacturing a group III nitride crystal as claimed in claim 2, wherein said removing step comprises the step of removing microcrystals precipitated on an inner wall surface of said holding vessel, and wherein said step of causing said crystal to make contact with said melt comprises the step of causing said seed crystal to said melt in said holding vessel after said microcrystals are removed.

6. The method for manufacturing a group III nitride crystal as claimed in claim 1, further comprising the step of disposing a crystal growth blocking part blocking growth of microcrystals grown from said nuclei in a close proximity to an inner wall surface of said holding vessel, before causing said seed crystal to contact with said melt.

* * * * *